US012718983B2

(12) United States Patent
Do et al.

(10) Patent No.: US 12,718,983 B2
(45) Date of Patent: Aug. 25, 2026

(54) CAPACITOR, ELECTRONIC DEVICE INCLUDING THE SAME, AND METHOD OF MANUFACTURING THE SAME

(71) Applicant: Samsung Electronics Co., Ltd., Suwon-si (KR)

(72) Inventors: Euncheol Do, Seoul (KR); Byunghoon Na, Suwon-si (KR); Kiyoung Lee, Seoul (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1186 days.

(21) Appl. No.: 17/705,818

(22) Filed: Mar. 28, 2022

(65) Prior Publication Data

US 2023/0063896 A1 Mar. 2, 2023

(30) Foreign Application Priority Data

Aug. 27, 2021 (KR) ........................ 10-2021-0114251

(51) Int. Cl.
*H01G 4/10* (2006.01)
*H01G 4/33* (2006.01)
*H10D 1/68* (2025.01)

(52) U.S. Cl.
CPC ................. *H01G 4/10* (2013.01); *H01G 4/33* (2013.01); *H10D 1/692* (2025.01)

(58) Field of Classification Search
CPC .......... H01G 4/10; H01G 4/33; H01G 4/1209; H01G 4/1272; H01G 4/30; H01G 13/00; H10D 1/692; Y02E 60/13
See application file for complete search history.

(56) References Cited

U.S. PATENT DOCUMENTS

| | | | |
|---|---|---|---|
| 10,910,383 | B2 | 2/2021 | Kim et al. |
| 2009/0273882 | A1 | 11/2009 | Park et al. |

(Continued)

FOREIGN PATENT DOCUMENTS

| | | | |
|---|---|---|---|
| JP | 2013-222826 | A | 10/2013 |
| KR | 10-1998-0073562 | A | 11/1998 |

(Continued)

OTHER PUBLICATIONS

Notice of Non-Final Rejection issued Sep. 8, 2023 in Korean Application No. 10-2021-0114251.

(Continued)

*Primary Examiner* — Mohammed R Alam
(74) *Attorney, Agent, or Firm* — Harness, Dickey & Pierce, P.L.C.

(57) ABSTRACT

Provided are a capacitor and a method for manufacturing the capacitor, the capacitor including: a first thin-film electrode layer; a second thin-film electrode layer; a dielectric layer, including a binary metal oxide, between the first thin-film electrode layer and the second thin-film electrode layer; and an interlayer, including an anionized layer, between the dielectric layer and at least one of the first thin-film electrode layer or the second thin-film electrode layer. The interlayer has a same type of crystal structure as and a different composition from the dielectric layer, and the anionized layer includes at least one of a monovalent cation, a divalent cation, or a trivalent cation.

20 Claims, 18 Drawing Sheets

(56) References Cited

U.S. PATENT DOCUMENTS

| | | | | |
|---|---|---|---|---|
| 2013/0071988 | A1 | 3/2013 | Deweerd et al. | |
| 2014/0167221 | A1 | 6/2014 | Rui et al. | |
| 2020/0013853 | A1 | 1/2020 | Cho et al. | |
| 2021/0043749 | A1 | 2/2021 | Lee et al. | |
| 2022/0344451 | A1* | 10/2022 | Beeler | H10D 1/684 |
| 2023/0035431 | A1 | 2/2023 | Do et al. | |

FOREIGN PATENT DOCUMENTS

| | | | |
|---|---|---|---|
| KR | 10-1046729 | B1 | 7/2011 |
| KR | 10-2018-0106149 | A | 10/2018 |
| KR | 10-2018-0120308 | A | 11/2018 |
| KR | 10-2021-0017526 | A | 2/2021 |

OTHER PUBLICATIONS

Takeaki Yajima et al., “Controlling band alignments by artificial interface dipoles at perovskite heterointerfaces,” Nature Communications, vol. 6, Apr. 7, 2015.

* cited by examiner

CAPACITOR, ELECTRONIC DEVICE INCLUDING THE SAME, AND METHOD OF MANUFACTURING THE SAME

CROSS-REFERENCE TO RELATED APPLICATION

This application is based on and claims priority under 35 U.S.C. § 119 to Korean Patent Application No. 10-2021-0114251, filed on Aug. 27, 2021, in the Korean Intellectual Property Office, the disclosure of which is incorporated by reference herein in its entirety.

BACKGROUND

1. Field

The present disclosure relates to a capacitor, an electronic device including the same, and a method of manufacturing the same.

2. Description of the Related Art

Dielectric including electronic devices such as semiconductor devices, memory, capacitors, and transistors are used in various household and industrial devices. To accommodate the growing demand high performance of household and industrial devices, high integration and miniaturization of these electronic devices are progressing.

According to the high integration and miniaturization of electronic devices, the sizes of these electronic devices are being reduced. For example, since the capacitance of a capacitor decreases and the leakage current increases as the size of the capacitor decreases, various methods have been proposed to solve these problems.

For example, by increasing the electrode area of a capacitor and/or reducing the thickness of a dielectric to change the structure of the capacitor, and/or by improving a capacitor manufacturing process, the capacitance of the capacitor may be maintained and/or improved even as the sizes of these electronic devices are also being reduced.

SUMMARY

However, there are limits to maintaining the capacitance of a capacitor by structural improvements (such as increasing the electrode area of the capacitor and/or reducing the thickness of a dielectric) and/or by improvements in manufacturing process.

For a higher capacitance of a capacitor, a binary metal oxide dielectric material including one metal element and oxygen can be used. A representative binary metal oxide dielectric, as a binary metal oxide including divalent cations, trivalent cations, and tetravalent cations, is a material having a 1:1 composition ratio of divalent cations and oxygen, a 2:3 composition ratio of trivalent cations and oxygen, and/or a 1:1 composition ratio of tetravalent cations and oxygen. The binary metal oxide may have various crystal structures. The binary metal oxide dielectric may be, for example, a material such as $TiO_2$, $HfO_2$, $ZrO_2$, and/or $SiO_2$. The binary metal oxide dielectric is not limited to these materials, and binary metal oxides including other cations may be used as the dielectric. However, a bandgap of the binary metal oxide dielectric may be as small as 3 eV to 4 eV, and thus, a leakage current between an electrode and the dielectric may be large.

Thus, it is important to suppress the leakage current between the electrode and the dielectric.

As a method for improving leakage current characteristics between the electrode and the dielectric, a method of controlling a Schottky barrier may be considered.

A Schottky barrier is the difference between the work function ($\phi$) of an electrode and the electron affinity ($\chi$) of the dielectric film (e.g., of a dielectric). For example, when the electrode and the dielectric come into contact, the Fermi levels thereof become equal, and thus, an energy barrier called the Schottky barrier is formed at the interface between the electrode and the dielectric, suppressing the movement of charges, and thus improving the leakage current. In some examples, e.g., when the dielectric is an N-type semiconductor, the greater the work function of the electrode is compared to than the electron affinity of the dielectric, the greater the height of the Schottky barrier may be.

In order to implement a high Schottky barrier height (SBH) between the dielectric and the electrode, there should be satisfied the conditions that the crystal structures and lattice constants of the dielectric and the electrode are similar, the stability of the interface between the dielectric and the electrode is high, and the electrode work function is greater than the electron affinity of the dielectric. However, it is not easy to implement a capacitor with a high SBH between the dielectric and the electrode.

Therefore, there is provided a new capacitor that has an increased SBH between the dielectric and the electrode, compared to a capacitor of the related art, and thus, suppresses the leakage current.

One or more embodiments include a capacitor in which a leakage current is suppressed by including an interlayer having a novel structure.

One or more embodiments include an electronic device including the capacitor.

One or more embodiments include a method of manufacturing the capacitor.

Additional aspects will be set forth in part in the description which follows and, in part, will be apparent from the description, and/or may be learned by practice of the presented embodiments of the disclosure.

According to one or more embodiments, provided is a capacitor including: a first thin-film electrode layer; a second thin-film electrode layer; a dielectric layer, including a binary metal oxide, between the first thin-film electrode layer and the second thin-film electrode layer; and an interlayer, including an anionized layer, between the dielectric layer and at least one of the first thin-film electrode layer or the second thin-film electrode layer. The interlayer has a same type of crystal structure as and a different composition from the dielectric layer, and the anionized layer includes at least one of a monovalent cation, a divalent cation, or a trivalent cation.

According to one or more embodiments, provided is an electronic device including the capacitor.

According to one or more embodiments, provided is a method of manufacturing the capacitor, the method including: forming one of a first thin-film electrode layer or a second thin-film electrode layer; epitaxially growing an interlayer, including an anionized layer, on one surface of the one of the first thin-film electrode layer or the second thin-film electrode layer; arranging a dielectric layer, including a binary metal oxide, on the interlayer; and arranging a remainder one of the first thin-film electrode layer or the second thin-film electrode layer. The interlayer has a same type of crystal structure as and a different composition from the dielectric layer, and the anionized layer includes at least one of a monovalent cation, a divalent cation, or a trivalent cation.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
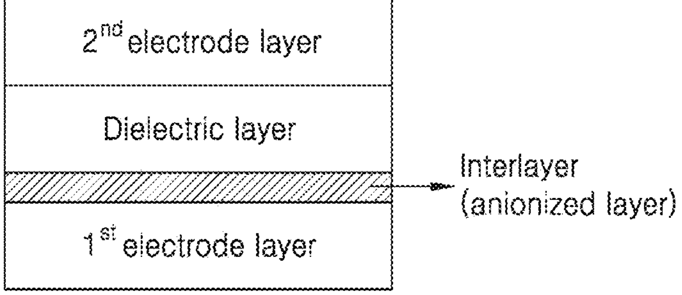
FIG. 1A shows a schematic view of a capacitor including an interlayer, according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to the accompanying drawings, in which example embodiments are shown. The present disclosure may, however, be embodied in many different forms, should not be construed as being limited to the embodiments set forth herein, and should be construed as including all modifications, equivalents, and alternatives within the scope of the present disclosure; rather, these embodiments are provided so that this disclosure will be thorough and complete, and will fully convey the effects and features of the present disclosure and ways to implement the disclosure to those skilled in the art.

The terminology used herein is for the purpose of describing particular embodiments only and is not intended to be limiting of the present disclosure. As used herein, the singular forms "a", "an" and/or "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the slash "/" or the term "and/or" includes any and all combinations of one or more of the associated listed items.

In the drawings, the dimension, size, and/or thickness of each layer, region, and/or element may be exaggerated and/or reduced for clarity, better understanding, and/or ease of description, and thus the present disclosure is not limited thereto.

When the terms "about," "similar," or "substantially" are used in this specification in connection with a numerical value, it is intended that the associated numerical value includes a manufacturing tolerance (e.g., ±10%) around the stated numerical value. Further, regardless of whether numerical values or shapes are modified as "about" or "substantially," it will be understood that these values and shapes should be construed as including a manufacturing or operational tolerance (e.g., ±10%) around the stated numerical values or shapes.

It will also be understood that when an element such as a layer, a film, a region, or a component is referred to as being "on" another layer or element, it can be "directly on" the other layer or element, or intervening layers, regions, or components may also be present. Although the terms "first", "second", etc., may be used herein to describe various elements, components, regions, and/or layers, these elements, components, regions, and/or layers should not be limited by these terms. These terms are used only to distinguish one component from another, not for purposes of limiting the elements, components, regions, and/or layers to e.g., an orientation, quantity, and/or order unless expressly indicated as otherwise. In the following description and drawings, constituent elements having substantially the same functional constitutions are assigned like reference numerals, and overlapping descriptions will be omitted.

Hereinafter, embodiments of a capacitor, an electronic device including the same, and a method of manufacturing the capacitor will be described in greater detail.

A capacitor according to some example embodiment includes a first thin-film electrode layer; a second thin-film electrode layer; a dielectric layer arranged between the first thin-film electrode layer and the second thin-film electrode layer; and an interlayer arranged between the dielectric and at least one of the first thin-film electrode layer or the second thin-film electrode layer. In some example embodiments, the dielectric layer includes a binary metal oxide; the interlayer has the same type of a crystal structure as and a different composition from the dielectric layer; the interlayer includes an anionized layer; and the anionized layer includes at least one of a monovalent cation, a divalent cation, and/or a trivalent cation.

The interlayer includes the anionized layer, and thus may induce a screening charge in a thin-film electrode layer adjacent thereto. The screening charge induces an additional electrostatic potential difference between the adjacent thin-film electrode layer and the dielectric layer. A Schottky barrier height (SBH) between the adjacent thin-film electrode layer and the dielectric layer is increased, and as a result, leakage current of the capacitor including the interlayer is reduced. For example, the anionized layer has negative charges, and thus, a screening charge with a positive charge is induced in the adjacent thin-film electrode layer. As a result, the leakage current of the capacitor including such an interlayer is reduced.

Referring to FIGS. 1A through 5D, a capacitor, according to some example embodiments, includes a first thin-film electrode layer; a second thin-film electrode layer; a dielectric layer arranged between the first thin-film electrode layer and the second thin-film electrode layer; and an interlayer arranged between the dielectric layer and at least one of the first thin-film electrode layer or the second thin-film electrode layer, wherein the interlayer includes an anionized layer. The dielectric layer includes a binary metal oxide.

For example, the interlayer may have the same and/or a similar type of crystal structure as that of the dielectric layer including a binary metal oxide. For example, in some example embodiments the interlayer may have a crystal structure that is not completely same as that of the dielectric layer including a binary metal oxide but belongs to the same type. For example, when the binary metal oxide included in the dielectric layer has a tetragonal crystal structure, the interlayer may have the tetragonal crystal structure. The interlayer has the same or a similar crystal structure as that of the dielectric layer, and thus, the structural stability of the interlayer and the dielectric layer may be improved, and/or the capacitor may have a reduced leakage current.

In some example embodiments, the first and/or the second thin-film electrode layer may include a conductive material such as a metal, a conductive oxide, a conductive nitride, and/or the like. The interlayer may have the same or a similar type of a crystal structure as that of the first and/or the second thin-film electrode layer. For example, the interlayer may have the same crystal structure as that of the first and/or the second thin-film electrode layer including a binary metal oxide (e.g., $RuO_2$ in FIG. 1B and/or Ta doped $SnO_2$ in FIG. 3B) and/or the interlayer may have a crystal structure that is not completely same as that of the first and/or second thin-film electrode layer including, e.g., a binary metal oxide but belongs to the same type. For example, the interlayer may have the same crystal structure as that of the thin-film electrode layer including a metal and/or the interlayer may have a crystal structure that is not completely same as that of the thin-film electrode layer including a metal but belongs to the same type, and/or the interlayer may have a similar type of a crystal structure as that of the first and/or the second thin-film electrode layer including a metal (e.g., platinum "Pt" in FIG. 2B). For example, the interlayer may have the same crystal structure as that of the thin-film electrode layer including a metal nitride and/the interlayer may have a crystal structure that is not completely same as that of the thin-film electrode layer including a metal nitride but belongs to the same type. For example, the interlayer may have a similar type of crystal structure as that of the first and/or the second thin-film electrode layer including a metal nitride (e.g., TiN). For example, when the thin-film electrode layer has a tetragonal (or cubic) crystal structure, the interlayer may also have the tetragonal (or cubic) crystal structure. In some example embodiments, similar crystal structures may include crystal structures with faces including similar lattice parameters. For example, a cubic structure may be considered similar to a tetragonal structure if at least two (e.g., the a and b) lattice parameters of the cubic structure are similar to at least two (e.g., the a and b) of the lattice parameters of the tetragonal structure. The interlayer has the same or similar crystal structure as that of the first and/or the second thin-film electrode layer, and thus, the structural stability of the interlayer and the thin-film electrode layer may be improved, and/or the capacitor may have a reduced leakage current.

For example, the anionized layer may be represented by $[A1O_2]^{-a}$. Here, A1 may be, for example, a monovalent cation, a divalent cation, and/or a trivalent cation, and a may be 1, 2, or 3. The capacitor includes such an anionized layer, and thus, a leakage current of the capacitor may be more effectively suppressed.

In some example embodiments, A1 may include an element that belongs to Group 1 to Group 13 of the periodic table of the elements. For example, A1 may include at least one of an alkali metal, an alkaline earth metal, a transition metal, and/or the like.

For example, A1 may be and/or include at least one of Li, Na, K, Rb or Cs (as an alkali metal element that forms a monovalent cation); Mg, Be, Ba or Ca (as an alkaline earth metal element that forms a divalent cation); and/or A1 may include A1, Ga, In, or B (which belong to Group 13 of the periodic table of the elements, as an element that forms a trivalent cation). In some example embodiments, when A1 has such an element, the capacitor can effectively induce an increased Schottky barrier height (SBH).

in some example embodiments, the composition of the anionized layer may be represented by, for example, $[AlO_2]^-$, $[GaO_2]^-$, $[InO_2]^-$, $[BO_2]^-$, $[BeO_2]^{-2}$, $[MgO_2]^{-2}$, $[BaO_2]^{-2}$, $[CaO_2]^{-2}$, $[LiO_2]^{-3}$, $[NaO_2]^{-3}$, $[KO_2]^{-3}$, and/or $[RbO_2]^{3-}$. The interlayer may include such an anionized layer, and thus a leakage current of the capacitor including the interlayer may be further effectively suppressed. The anionized layer may be identified and/or confirmed using, for example, high-angle annular dark-field-scanning transmission electron microscopy (HAADF-STEM).

The interlayer includes the anionized layer, and thus may be formed of a single compound. The compound that forms the interlayer may be unstable in a bulk state, but may maintain stability when it has a thickness of several nanometers or less.

For example, the interlayer may include a binary metal oxide represented by Formula 1:

$$[A2_aO_b] \quad \text{<Formula 1>}$$

wherein, in Formula 1, A2 is at least one of a monovalent cation, a divalent cation, and/or a trivalent cation, and $1.0 \le a \le 3.0$, $2.0 \le b \le 5.0$, and $0.5 < b/a \le 2.5$.

The interlayer may include, for example a metal oxide represented by at least one of $[Al_aO_b]$, $[Ga_aO_b]$, $[In_aO_b]$, $[B_aO_b]$, $[Be_aO_b]$, $[Mg_aO_b]$, $[Ba_aO_b]$, $[Ca_aO_b]$, $[Li_aO_b]$, $[Na_aO_b]$, $[K_aO_b]$, and/or $[Rb_aO_b]$, wherein $1.0 \leq a \leq 3.0$, $2.0 \leq b \leq 5.0$, and $0.5 < b/a \leq 2.5$.

For example, the interlayer may include a binary metal oxide represented by Formula 2:

$$[A3O_x] \quad \text{<Formula 2>}$$

wherein, in Formula 2, A3 is at least one of a monovalent cation, a divalent cation, and/or a trivalent cation, and $0.5 < x \leq 2.0$.

The interlayer may include, for example, a metal oxide represented by at least one of $[AlO_x]$, $[GaO_x]$, $[InO_x]$, and $[BO_x]$, wherein $1.5 < x \leq 2.0$.

The interlayer may include, for example, a metal oxide represented by at least one of $[BeO_y]$, $[MgO_y]$, $[BaO_y]$, and $[CaO_y]$, wherein $1 < y \leq 2$.

The interlayer may include, for example, a metal oxide represented by at least one of $[LiO_z]$, $[NaO_z]$, $[KO_z]$, and $[RbO_z]$, wherein $0.5 < z \leq 2$.

Figure 5A:
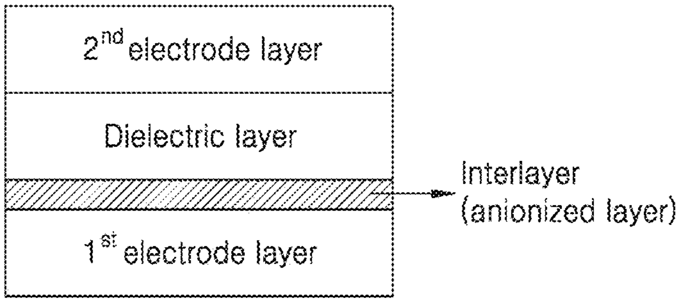
FIG. 5A shows a schematic view of a capacitor including an interlayer, according to some example embodiments.
Figure 5B:
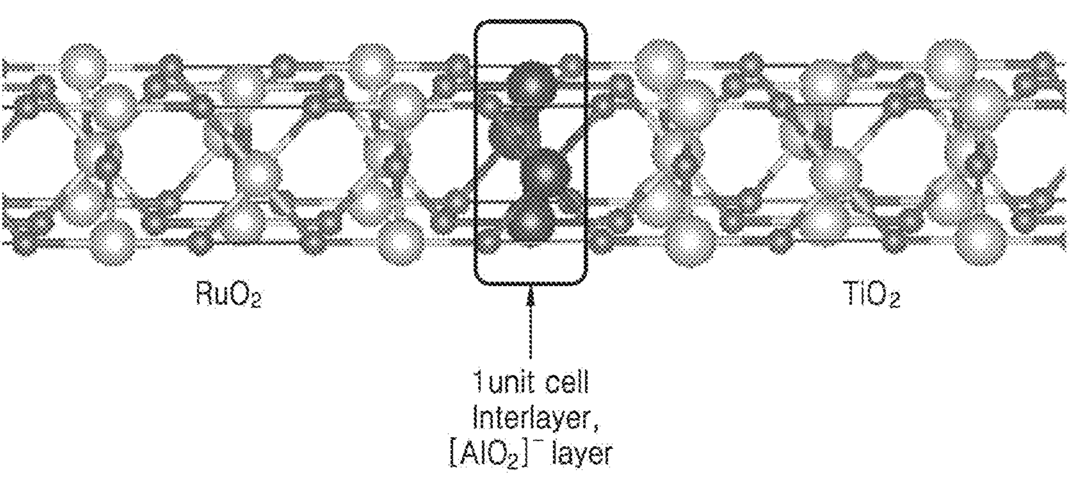
FIG. 5B shows a schematic view showing a magnified structure of an interlayer portion of a capacitor including an interlayer having 1 unit cell, according to some example embodiments.
Figure 5C:
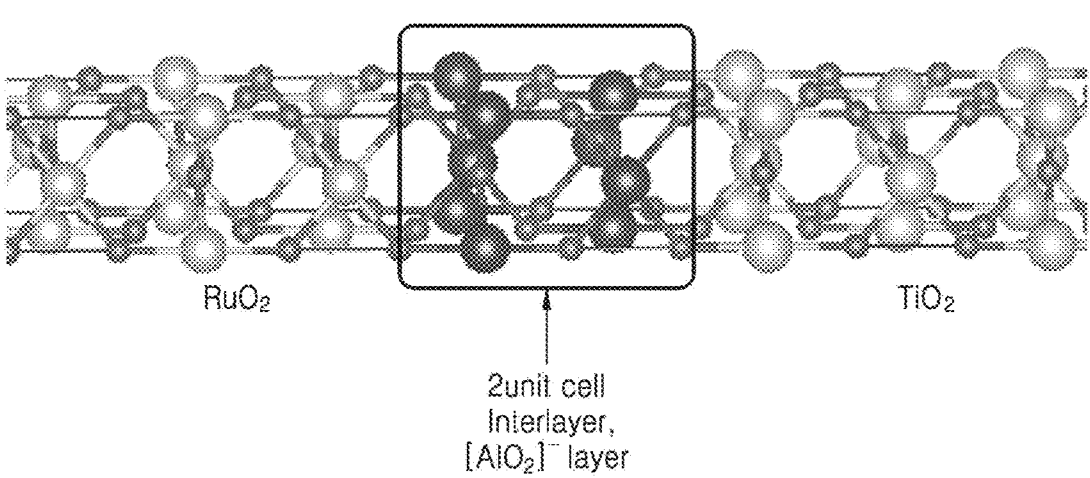
FIG. 5C shows a schematic view showing a magnified structure of an interlayer portion of a capacitor including an interlayer having 2-unit cells, according to some example embodiments.
Figure 5D:
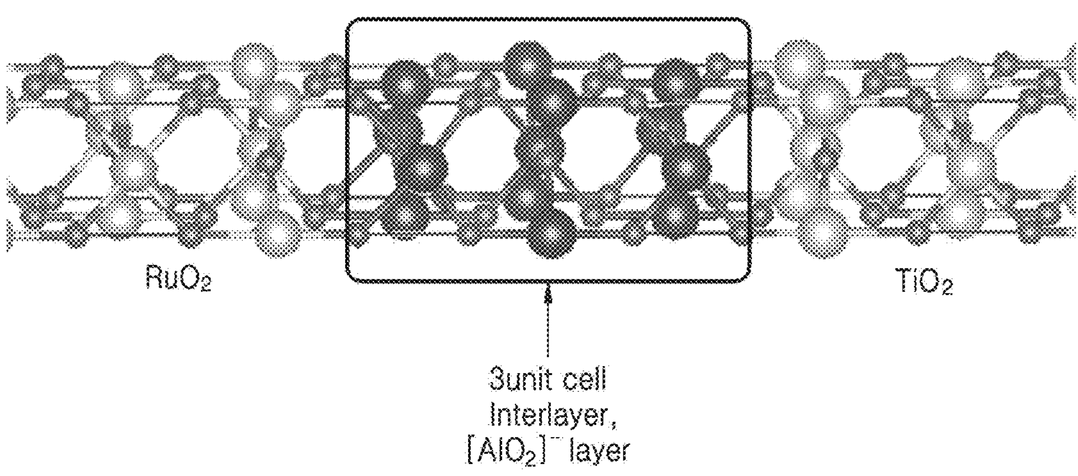
FIG. 5D shows a schematic view showing a magnified structure of an interlayer portion of a capacitor including an interlayer having 3-unit cells, according to some example embodiments.

Referring to FIGS. 5A and 5B, a capacitor, according to some example embodiments, includes a first thin-film electrode layer; a second thin-film electrode layer; a dielectric layer arranged between the first thin-film electrode layer and the second thin-film electrode layer; and an interlayer arranged between the dielectric layer and at least one of the first thin-film electrode layer and or the second thin-film electrode layers. The interlayer may have a thickness of, for example, one to three unit cells, and/or one to two unit cells. The dielectric layer may include a binary metal oxide. As described above, the interlayer having a thickness of one to three unit cells may have an increased Schottky barrier height (SBH) while maintaining structural stability. A thickness of the interlayer may be, for example, about 1 angstrom (Å) to about 15 Å, about 2 Å to about 12 Å, and/or about 2 Å to about 10 Å.

In the capacitor including the interlayer, a SBH between the first thin-film electrode layer or the second thin-film electrode layer and the dielectric layer may be 0.5 eV or more, or 1.0 eV or more.

For example, in the capacitor including the interlayer, a SBH between the first thin-film electrode layer or the second thin-film electrode layer and the dielectric layer may be about 0.5 eV to about 2.0 eV, and/or about 1.0 eV to about 2.0 eV.

The interlayer may be formed by, for example, epitaxial growth. Accordingly, the interlayer may have the same and/or a similar crystal structure, a same or similar lattice constant and/or the like as that of the thin-film electrode layer and/or the dielectric layer and may have improved interfacial stability.

An SBH of the capacitor including the interlayer may be larger than that of an interlayer-free capacitor by about 0.5 eV or more, 1.0 eV or more, and/or 1.5 eV or more. The SBH of the capacitor including the interlayer may be larger than that of an interlayer-free capacitor by about 0.5 eV to about 3.0 eV, about 1.0 eV to about 3.0 eV, and/or about 1.5 eV to about 3.0 eV. When the SBH of the capacitor including the interlayer is larger than that of an interlayer-free capacitor by 1.0 eV or greater, a leakage current of the capacitor including the interlayer may be remarkably reduced.

Referring to FIGS. 1A through 5D, the capacitor according to one or more embodiments includes: a first thin-film electrode layer; a second thin-film electrode layer; a dielectric layer arranged between the first thin-film electrode layer and the second thin-film electrode layer; and an interlayer arranged between the dielectric layer and at least one of the first thin-film electrode layer and/or the second thin-film electrode layer. The dielectric included in the dielectric layer is not specifically limited to the above examples. A dielectric constant of the dielectric at room temperature (25° C.) in a range of 1 kHz to 1 MHz may be, for example, 50 or more, 100 or more, 250 or more, and/or 500 or more. The dielectric constant of the dielectric at room temperature (25° C.) in a range of 1 kHz to 1 MHz may be, for example, 100,000 or less, 50,000 or less, 10,000 or less, 5000 or less, 1000 or less, and/or 500 or less. The dielectric constant of the dielectric at room temperature (25° C.) in a range of 1 kHz to 1 MHz may be about 100 to about 100,000, about 100 to about 10,000, about 100 to about 1000, and/or about 100 to about 500.

The dielectric layer may include, for example, a binary metal oxide dielectric represented by Formula 3:

$$A4_aO_b \quad \text{<Formula 3>}$$

wherein, in Formula 3, A4 is at least one of a monovalent cation, a divalent cation, or a trivalent cation, and $1.0 \leq a \leq 3.0$, and $2.0 \leq b \leq 5.0$.

For example, A4 may include an element that belongs to Group 1 to Group 14 of the periodic table of the elements.

The dielectric layer may include, for example, at least one binary metal oxide dielectric selected from among $TiO_2$, $HfO_2$, $ZrO_2$, $SiO_2$, $Al_2O_3$, $La_2O_3$, $GdO_2$, $SrO_2$, $Y_2O_3$, $La_2O_3$, $Nb_2O_5$, $Ta_2O_5$, $Cr_2O_3$, CuO, $Fe_2O_3$, $Ga_2O_3$, $In_2O_3$, MgO, $Nb_2O_5$, NiO, $SnO_2$, $Ta_2O_5$, $Sc_2O_3$, $GeO_2$, $CeO_2$, $PrO_x$ (wherein x=1 to 5), $Nd_2O_3$, $Sm_2O_3$, $EuO_y$ (wherein y=1 to 5), $Gd_2O_3$, $Dy_2O_3$, $Ho_2O_3$, $Er_2O_3$, $Tm_2O_3$, $Yb_2O_3$, $Lu_2O_3$, and/or the like. The dielectric is not necessarily limited thereto, and any binary metal oxide dielectric available in the art may be used. For example, $TiO_2$ may be $TiO_2$ having a rutile structure.

A thickness of the dielectric layer included in the capacitor may be, for example, about 5 nm to about 100 nm, and/or about 10 nm to about 100 nm. When the thickness of the dielectric layer excessively increases, the capacity per unit volume of the capacitor may be reduced. In addition, when the thickness of the dielectric layer is excessively small, a proportion of a dielectric constant reduction region in the interface may be increased, and thus the capacity per unit volume of the capacitor may be reduced.

A thickness of the first thin-film electrode layer and/or the second thin-film electrode layer included in the capacitor may be, for example, about 10 nm to about 1000 nm, about 10 nm to about 500 nm, or about 10 nm to about 100 nm. When the thickness of the thin-film electrode layer excessively increases, the capacity per unit volume of the capacitor may be reduced. In addition, when the thickness of the thin-film electrode layer is excessively small and the thickness of the dielectric layer is excessively small, a proportion of the dielectric constant reduction region in the interface may be increased, and thus the capacity per unit volume of the capacitor may be reduced.

The first thin-film electrode layer and the second thin-film electrode layer that are included in the capacitor may have various crystal structures. For example, the first thin-film electrode layer and the second thin-film electrode layer may have at least one of a tetragonal structure, a cubic structure, a hexagonal structure, a monoclinic structure, a triclinic structure, or an orthorhombic structure. The thin-film electrode layers have such a crystal structure, and thus may have improved interfacial stability with the dielectric layer.

At least one of the first thin-film electrode layer and the second thin-film electrode layer may include at least one selected from among a metal, a metal oxide, a doped metal oxide, a metal nitride, and/or a metal carbide.

The metal included in at least one of the first thin-film electrode layer and the second thin-film electrode layer may include, for example, at least one selected from among Ti, W, Ta, Co, Mo, Ni, V, Hf, Al, Cu, Pt, Pd, Ir, Au, and Ru. The metal included in at least one of the first thin-film electrode layer and the second thin-film electrode layer is not limited to these metals, and any metal that is used for electrode layers in the film may be used.

The metal oxide included in at least one of the first thin-film electrode layer and the second thin-film electrode layer may include, for example, at least one selected from among $RuO_2$, $IrO_2$, $PtO_2$, $SnO_2$, $MnO_2$, $Sb_2O_3$, and $In_2O_3$. The metal oxide included in at least one of the first thin-film electrode layer and the second thin-film electrode layer is not limited to these metals, and any metal oxide that is used for electrode layers in the film may be used.

The doped metal oxide used in at least one of the first thin-film electrode layer and the second thin-film electrode layer may include, for example, Ta-doped $SnO_2$, Ti-doped $In_2O_3$, Ni-doped $SnO_2$, Sb-doped $SnO_2$, and Al-doped ZnO. The doped metal oxide included in at least one of the first thin-film electrode layer and the second thin-film electrode layer is not limited to these metals, and any doped metal oxide that is used for electrode layers in the film may be used. The type of a dopant of the doped metal is not specifically limited, and any dopant that improves conductivity of a metal oxide is possible. The dopant may be, for example, a transition metal.

The metal nitride included in at least one of the first thin-film electrode layer and the second thin-film electrode layer may include, for example, at least one selected from among TiN, WN, TaN, TiAlN, TaSiN, TiSiN, WSiN, TiAlN, TiCN, TiAlCN, RuCN, and RuTiN. The metal nitride included in at least one of the first thin-film electrode layer and the second thin-film electrode layer is not limited to these metals, and any metal nitride that is used for electrode layers in the film may be used. The metal nitride may include a carbon-containing nitride of a metal.

The capacitor includes the interlayer described above, and thus a leakage current may be reduced. The type of the capacitor is not specifically limited. The capacitor may be, for example, a capacitor device used in memory cells, a stacked capacitor used in stacked ceramic condensers, and/or the like.

Figure 6A:
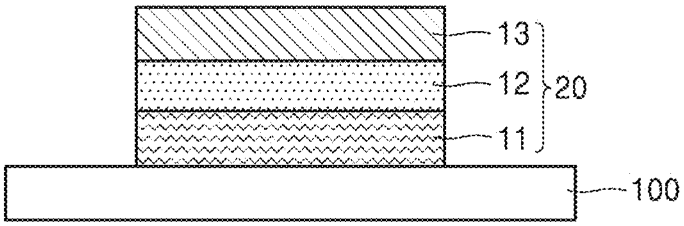
FIGS. 6A to 6D show schematic views of capacitors according to some example embodiments.

FIG. 6A shows a structure of a capacitor 20 including the interlayer (not shown) described above. The structure includes an insulating substrate 100, a first thin-film electrode 11 and a second thin-film electrode 13 as a pair of electrodes, and a dielectric layer 12. The first thin-film electrode 11 and the second thin-film electrode 13 function as a lower thin-film electrode and an upper thin-film electrode, respectively. The first thin-film electrode 11 and the second thin-film electrode 13 do not electrically contact each other, and the dielectric layer 12 is arranged between the first thin-film electrode 11 and the second thin-film electrode 13. An interlayer (not shown) is arranged between the first thin-film electrode 11 and the dielectric layer 12 and/or between the second thin-film electrode 13 and the dielectric layer 12.

Figure 6B:
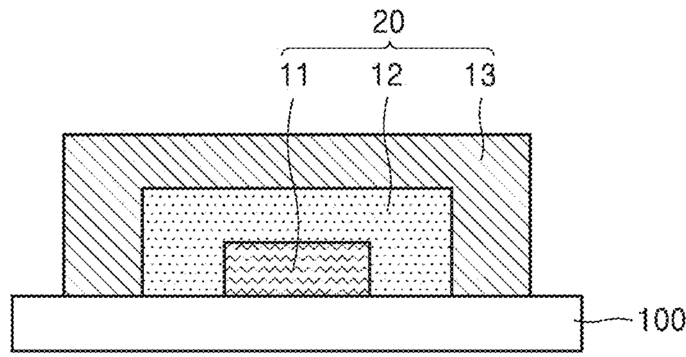
Figure 6C:
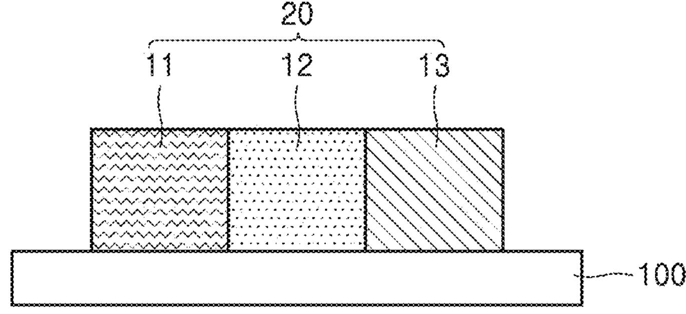
Figure 6D:
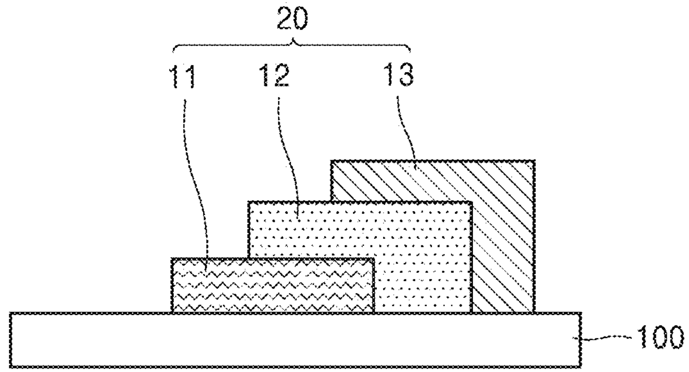

FIGS. 6B to 6D show other examples of structures of capacitors 20, each including the interlayer (not shown) described above.

Referring to FIG. 6B, a dielectric layer 12 is arranged so as to coat a first thin-film electrode 11 on an insulating substrate 100, and a second thin-film electrode 13 is arranged so as to coat the dielectric layer 12. The interlayer (not shown) is arranged between the first thin-film electrode 11 and the dielectric layer 12 and/or between the second thin-film electrode 13 and the dielectric layer 12.

Referring to FIG. 6C, a first thin-film electrode 11 and a second thin-film electrode 13 are arranged on an insulating substrate 100, and a dielectric layer 12 is arranged therebetween. The interlayer (not shown) is arranged between the first thin-film electrode 11 and the dielectric layer 12 and/or between the second thin-film electrode 13 and the dielectric layer 12.

Referring to FIG. 6D, a dielectric layer 12 is arranged so as to coat a portion of a first thin-film electrode 11 on an insulating substrate 100, and a second thin-film electrode 13 is arranged so as to coat a portion of the dielectric layer 12. The interlayer (not shown) is arranged between the first thin-film electrode 11 and the dielectric layer 12 and/or between the second thin-film electrode 13 and the dielectric layer 12.

Figure 7:
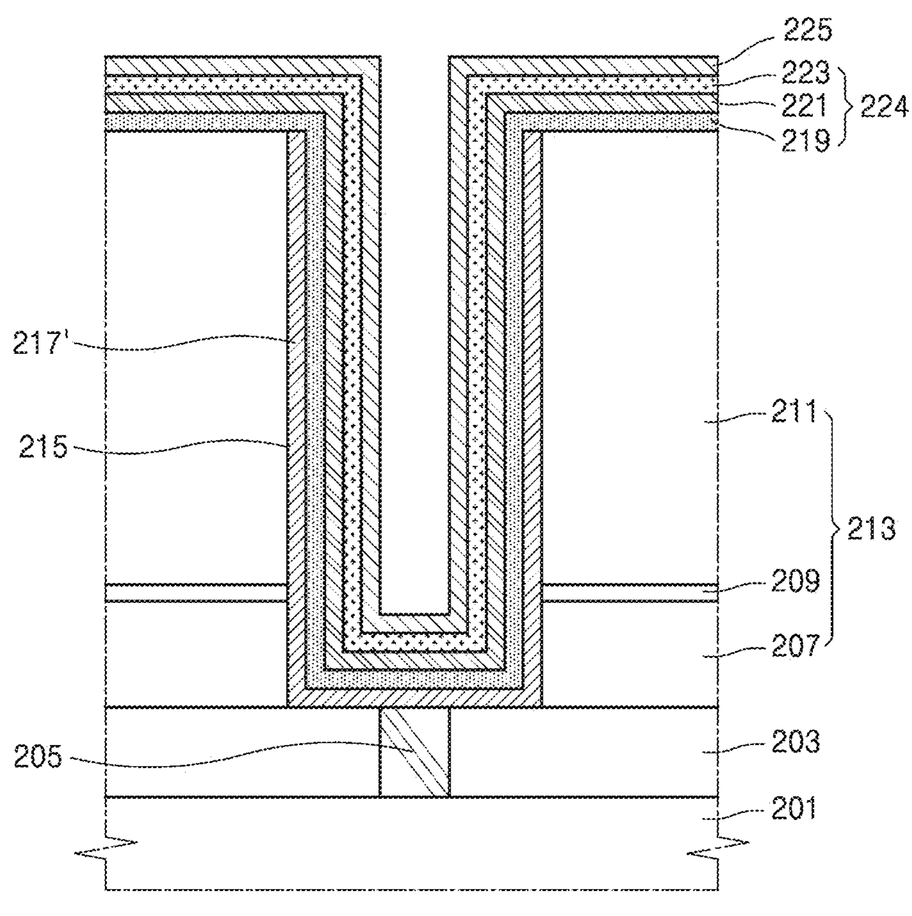
FIG. 7 is a cross-sectional view showing a structure of a metal-insulator-metal capacitor (MIM capacitor) according to some example embodiments.

FIG. 7 shows a structure of a metal-insulator-metal (MIM) capacitor according to another embodiment.

Referring to FIG. 7, an interlayer insulating film 203 is stacked on a semiconductor substrate 201, and formed in the interlayer insulating film 203 is a contact plug 205 filling a contact hole that exposes the semiconductor substrate 201. A mold insulating film 213 is formed on the substrate having the contact plug 205. The mold insulating film 213 has a structure in which a lower mold insulating film 207, an etch stop film 209, and an upper mold film 211 are sequentially stacked on the substrate having the contact plug 205. The etch stop film 209 is not limited to the position illustrated in FIG. 7, and may be directly formed on the upper surfaces of the contact plug 205 and the interlayer insulating film 203. In other embodiments, the mold insulating film 213 may be formed as a double-layered mold insulating film including the lower mold insulating film 207 and the upper mold insulating film 211, or as a single mold insulating layer. The lower mold insulating film 207 and the upper mold insulating film 211 may have an etch selectivity with respect to the etch stop film 209. For example, when the lower mold insulating film 207 and the mold insulating film 213 are formed of a silicon oxide film, the etch stop film 209 may be formed of a silicon nitride film. The mold insulating film 213 is patterned to form a storage node hole 215 that exposes the upper surface of the contact plug 205 and the upper surface of the interlayer insulating film 203. In some example embodiments, the contact plug 205 may include a conductive material, and may electrically connected the MIM capacitor to another electric device (e.g., a transistor).

A lower-electrode film 217' (e.g., a conductive film for a lower electrode), is formed on the entire surface of the semiconductor substrate having the storage node hole 215. The conductive film 217' for the lower electrode may be formed as a conductive film that has excellent step coverage, is less deformed during a subsequent process of forming a dielectric film and has an oxidation resistant property. For example, the conductive film 217' for a lower electrode may be formed of at least one metal oxide film selected from among strontium-ruthenium oxide ($SrRuO_3$), iridium-ruthenium oxide ($SrIrO_3$), calcium-ruthenium oxide ($CaRuO_3$), calcium-nickel oxide ($CaNiO_3$), barium-ruthenium oxide ($BaRuO_3$), and barium-strontium-ruthenium oxide ($(Ba,Sr)RuO_3$).

A buffer insulating film 219 is formed on the conductive film 217' for a lower electrode, and a lower electrode 217' and a buffer insulating-film pattern (not shown) that are isolated within the storage node hole 215 are formed. The buffer insulating film pattern (not shown) has a structure that is selectively removed to expose the inner wall of the lower electrode (217'). A dielectric film 224 in which a lower dielectric film 219 and an upper dielectric film 223 are sequentially stacked is formed over the entire surface of the semiconductor substrate 201 having the lower electrode 217'. The lower dielectric film 219 and the upper dielectric film 223 may contain a dielectric. For example, the upper dielectric film 223 may be formed of a high-k dielectric film having a higher dielectric constant than the lower dielectric film 219. In addition, the lower dielectric film 219 may form a dielectric film having a higher energy bandgap compared to the upper dielectric film 223.

For example, the lower dielectric film 219 or the upper dielectric film 223 may be formed of a metal oxide film selected from among strontium-titanium oxide ($SrTiO_3$), lithium-niobium oxide ($LiNbO_3$,), potassium-niobium oxide ($KNbO_3$), potassium-thallium oxide ($KTaO_3$), barium-titanium oxide ($BaTiO_3$), sodium-niobium oxide ($NaNbO_3$), sodium-thallium oxide ($NaTaO_3$), calcium-zirconium oxide ($CaZrO_3$), barium-zirconium oxide ($BaZrO_3$), and strontium-zirconium oxide ($SrZrO_3$).

In other embodiments, although not illustrated, the lower dielectric film 219 and the upper dielectric film 223 may form a single dielectric film, and this dielectric film may be formed of a metal oxide film as listed above.

An upper electrode 225 is formed on the upper dielectric layer 223, and the upper electrode 225 may be formed of a metal film having a work function greater than that of the lower electrode 217'.

The upper electrode 225 may be formed of at least one noble metal film selected from among a Ru film, a Pt film, an Ir film; and/or the like.

In some example embodiments, the upper dielectric film 223 may be formed of at least one film selected from among a $Ta_2O_5$ film, a $TiO_2$ film, a doped $TiO_2$ film, and an STO film, and the lower dielectric film 219 may be formed of at least one film selected from among an $HfO_2$ film, a $ZrO_2$ film, an $Al_2O_3$ film, and a $La_2O_3$ film.

For example, the upper dielectric film 223 and the lower dielectric film 219 may be formed of a strontium-titanium oxide ($SrTiO_3$) film.

An intermediate dielectric film 221 is interposed between the lower dielectric film 219 and the upper dielectric film 223. The lower dielectric film 219 and the upper dielectric film 223 may be formed as crystalline or amorphous dielectric films, and the intermediate dielectric film 221 may be formed as a crystalline or amorphous dielectric film. That is, the lower dielectric film 219 may be formed of at least one film selected from among a $HfO_2$ film, a $ZrO_2$ film, a $Al_2O_3$ film, and a $La_2O_3$ film, each having a crystalline or amorphous structure, and the intermediate dielectric film 221 may be formed of a strontium-titanium oxide ($SrTiO_3$) film.

For example, the intermediate dielectric film 221 may be formed of at least one film selected from among an $HfO_2$ film, a $ZrO_2$ film, an $Al_2O_3$ film, a $La_2O_3$ film, a $Ta_2O_5$ film, a doped TiO film, a STO film, and/or the like, each having a crystalline or amorphous structure. For example, the intermediate dielectric film 221 may be formed of a strontium-titanium oxide ($SrTiO_3$) film. Further, the intermediate dielectric film 221 may be formed of at least one film selected from among a $Ta_2O_5$ film, a TiO film, a doped TiO film, and a STO film, each having a crystalline or amorphous structure. As described above, the intermediate dielectric film 221 is forms as a dielectric film having a crystalline or amorphous structure, and thus breakdown voltage characteristics of the dielectric film 224 may be improved. For example, when the lower dielectric film 219 and the upper dielectric film 223 are formed as dielectric films each having a crystalline structure, breakdown voltages of the lower dielectric film 219 and the upper dielectric film 223 may be improved, but leakage current characteristics may be deteriorated. Accordingly, the intermediate dielectric film 221, which is a dielectric film having an amorphous structure, is formed between the lower dielectric film 219 and the upper dielectric film 223, and thus a capacitor having excellent electrical characteristics, such as leakage current characteristics and breakdown voltage characteristics, may be provided.

An interlayer (not shown) is formed, e.g., between an entire surface of the lower electrode 217' and the dielectric film 224 in which the lower dielectric film 219, the intermediate dielectric film 221, and the upper dielectric film 223 are sequentially stacked.

By additionally including the interlayer (not shown), the MIM capacitor may have further improved leakage current characteristics.

The MIM capacitor shown in FIG. 7 has a concave structure or a cylinder structure.

An electronic device according to another embodiment includes the capacitor described above. The electronic device has the capacitor including the interlayer, and thus has reduced leakage current and provides excellent device characteristics.

The electronic device may be, for example, a semiconductor device. The electronic device may be, for example, a memory device. The memory device may be, for example, dynamic random access memory (DRAM), a flash memory, or the like.

Figure 8:
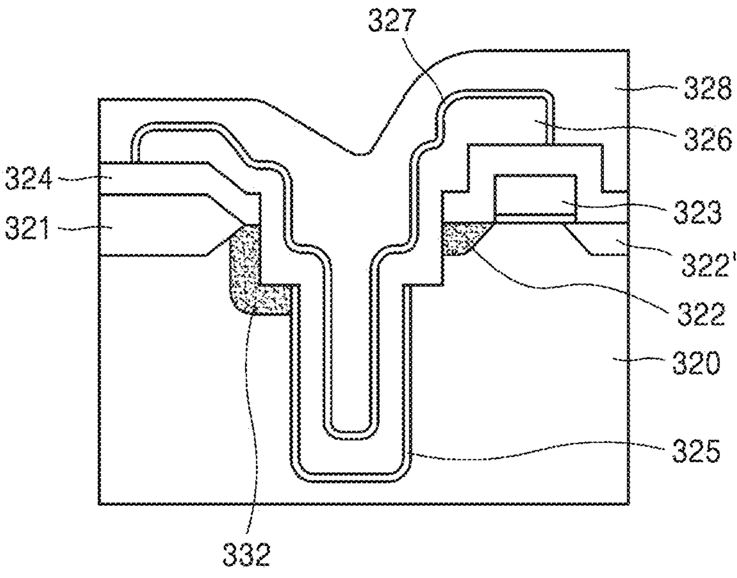
FIG. 8 shows a structure of a trench capacitor-type dynamic random-access memory (DRAM) according to some example embodiments.

FIG. 8 shows a structure of a trench capacitor type dynamic random access memory (trench capacitor type DRAM).

Referring to FIG. 8, a device isolation region is formed of a field oxide film 321 on a P-type semiconductor substrate 320. A gate electrode 323 and source/drain impurity regions 322 and 322' are formed in the device isolation region. A high-temperature oxide (HTO) film is formed as an interlayer insulating film 324. A portion where a trench is not to be formed is capped with a trench buffer layer, and then, a portion of the source region 322 is opened to form a contact portion.

A trench is formed on the sidewall of the interlayer insulating film 324, and a sidewall oxide film 325 is formed on the entire sidewall of the trench. The sidewall oxide film 325 compensates for damage occurred in the semiconductor substrate during etching for forming the trench, and also serves as a dielectric film between the silicon substrate and a storage electrode to be formed later. In the source region 322 formed on the trench sidewall, the entire sidewall S of the source region is exposed, except for a portion of the source region 322 on the gate side.

A PN junction 332 is formed on a sidewall portion S of the source region 322 by impurity injection, the source region 322 is formed at the left side of the gate electrode, and the drain region 322' is formed at the right side of the gate electrode. A trench is formed in the source region 322, the gate side of the sidewall of the trench T is in direct contact with the source region 322, and impurities are additionally injected into the source region 322 to form a the PN junction 332 on the other side.

A polysilicon layer is formed as a storage electrode 326 on a part of the interlayer insulating film 324, the exposed source region, and the surface of the sidewall oxide film 325 in the trench. The storage electrode 326 is formed to contact not only the source region 322 on the side of the gate electrode 323, but also the entire source region 322 in contact with the circumference of the upper wall of the trench. Further, the source region 322 formed around the upper sidewall of the trench is enlarged due to the injected impurities, and thus the source region more securely contacts the storage electrode 326. Then, a dielectric insulating film 327 is formed of the dielectric of a capacitor along the upper surface of the storage electrode 326, and a polysilicon layer, as a plate electrode 328, is formed on the insulating film 327, thereby completing a trench capacitor type DRAM.

In the trench capacitor type DRAM, the interlayer (not shown) described above may be additionally arranged between the storage electrode 326 and the dielectric insulating film 327.

A method of manufacturing the capacitor, according to some example embodiments, includes: providing a first thin-film electrode layer (or a second thin-film electrode layer); epitaxially growing an interlayer on one surface of the first thin-film electrode layer (or the second thin-film electrode layer); arranging a dielectric layer on the interlayer; and arranging a remainder one of the first or second thin-film electrode layer on the dielectric layer to provide a capacitor including: a first thin-film electrode layer; a second thin-film electrode layer; a dielectric layer arranged between the first thin-film electrode layer and the second thin-film electrode layer; and an interlayer arranged between the dielectric and at least one the first thin-film electrode layer or the second thin-film electrode layer. The dielectric layer may include a binary metal oxide, the interlayer has the same type of a crystal structure as and a different composition from the dielectric layer, the interlayer includes an anionized layer, and the anionized layer includes at least one of a monovalent cation, a divalent cation, or a trivalent cation.

The capacitor manufactured by the manufacturing method described above includes the interlayer, and thus have a reduced leakage current.

Referring to FIGS. 6A to 6D, first, a first thin-film electrode 11 or a second thin-film electrode 13 is provided.

The first thin-film electrode 11 and/or the second thin-film electrode 13 may each independently include, for example, iridium (Ir), an iridium-ruthenium alloy (IrRu), iridium oxide ($IrO_2$), titanium-aluminum nitride (TiAlN), titanium oxide ($TiO_2$), ruthenium (Ru), platinum (Pt), zirconium oxide ($ZrO_2$), tin oxide ($SnO_2$), indium-tin oxide (ITO), and/or the like. However, the example embodiments are not limited thereto, and any electrode material available in the field may be used. These materials may be used alone or in a mixed form.

At least one of the first thin-film electrode 11 and the second thin-film electrode 13 may include at least one selected from among a metal, a metal oxide, a doped metal oxide, a metal nitride, and/or a metal carbide. For example, at least one of the first thin-film electrode 11 and/or the second thin-film electrode 13 may be at least one of Ti, W, Ta, Co, Mo, Ni, V, Hf, Al, Cu, Pt, Pd, Ir, Au, Ru, $RuO_2$, $IrO_2$, $PtO_2$, $SnO_2$, Ta-doped $SnO_2$, TiN, WN, TaN, TiAlN, TaSiN, TiSiN, WSiN, TiAlN, TiCN, TiAlCN, RuCN, and/or RuTiN.

The first thin-film electrode 11 and/or the second thin-film electrode 13 may be formed by depositing a metal, a metal oxide, a metal nitride, a metal oxynitride, or a metal alloy through an electron-beam epitaxy process, a liquid epitaxy process, a vapor epitaxy process, a chemical vapor deposition process, a sputtering process, an atomic layer deposition process, a pulsed laser deposition process, and/or the like.

The first electrode 11 and the second electrode 13 may each have, for example, a single-layer structure or a multi-layer structure.

In some other embodiments, the first electrode 11 or the second electrode 13 may be formed by heat-treating a coating film obtained by coating and drying an electrode paste including a conductive material.

The electrode paste may include conductive material particles, an organic component, and a solvent. The coating method may, e.g., not use a vacuum process or a high-temperature process, and thus it is possible to simply manufacture the first electrode 11 or the second electrode 13.

The conductive material may be any conductive material that can be used in general for electrodes. Examples of the conductive material include: conductive metal oxides such as tin oxide, indium oxide, and indium-tin oxide (ITO); metals such as platinum, gold, silver, copper, iron, tin, zinc, aluminum, indium, chromium, lithium, sodium, potassium, cesium, calcium, magnesium, palladium, molybdenum, amorphous silicon, and polysilicon, or alloys thereof; inorganic compound conductive materials such as copper iodide, copper sulfide, or the like; complexes of polythiophene, polypyrrole, polyaniline, polyethylenedioxythiophene, or the like with polystyrene sulfonic acid; and/or carbon materials such as conductive polymers of which the conductivity is improved by doping with iodine. Although the conductive material may be used alone, a plurality of conductive materials may be used in combination by laminating or mixing.

The conductive material may be, for example, metal particles. By using metal particles, the bending resistance of the capacitor is improved, or a coercive electric field does not increase even when voltages are repeatedly applied. Thus, uneven portions are formed on the surface of the conductive film, and the dielectric layer is disposed on the uneven portions to exhibit an anchor effect, thereby improving the contact between the electrode and the dielectric layer. For example, the metal particles may include at least one selected from gold, silver, copper, platinum, lead, tin, nickel, aluminum, tungsten, molybdenum, ruthenium oxide, chromium, titanium, carbon, and indium.

The organic component and the solvent that are used in the electrode paste may be the same as those used in the dielectric layer.

Next, the interlayer (not shown) is arranged on one surface of the first thin-film electrode 11 or the second thin-film electrode 13 by epitaxial growth.

The interlayer may include any of the anionized layers as described above. For more details on the interlayer, the descriptions provided above in connection with the capacitor may be referred to.

For example, the epitaxial growth may be performed using a molecular beam epitaxy process, a liquid phase epitaxy process, a vapor phrase epitaxy process, or the like. The epitaxial growth may use, for example, atomic layer deposition (ALD), pulsed laser deposition (PLD), and/or the like.

When the interlayer (not shown) is formed using a molecular beam epitaxy process, for example, after an insulating substrate 100 on which the first thin electrode 11 that is surface-treated is formed is loaded into a reaction chamber, the first thin-film electrode 11 may be maintained at a temperature of about 400° C. to about 800° C., and a partial pressure of an oxidant, for example, an oxygen partial pressure may be maintained at about $10^{-8}$ Torr to about $10^{-5}$ Torr in the chamber. A metal for forming the interlayer may be supplied by sublimating the metal from a metal precursor.

Subsequently, a gaseous metal is provided onto the surface-treated first electrode 11, and then an oxidant may be supplied to form the interlayer (not shown) on the surface-treated first thin-film electrode 11. When the interlayer (not shown) includes a $[GaO_2]^-$ layer, and the metal precursor consists of gallium or a gallium-containing first precursor compound, the oxidant may include oxygen ($O_2$), ozone ($O_3$), nitrogen dioxide ($NO_2$), or dinitrogen oxide ($N_2O$). The oxidant may be, for example, oxygen.

Next, on the interlayer (not shown) the dielectric layer 12 may be arranged.

The dielectric layer 12 may include a binary metal oxide. The dielectric layer 12 may include, for example, at least one binary metal oxide dielectric be selected from among $TiO_2$, $HfO_2$, $ZrO_2$, $SiO_2$, $Al_2O_3$, $La_2O_3$, $GdO_2$, $SrO_2$, $Y_2O_3$, $La_2O_3$, $Nb_2O_5$, $Ta_2O_5$, $Cr_2O_3$, CuO, $Fe_2O_3$, $Ga_2O_3$, $In_2O_3$, MgO, $Nb_2O_5$, NiO, $SnO_2$, $Ta_2O_5$, $Sc_2O_3$, $GeO_2$, $CeO_2$, $PrO_x$ (wherein x=1 to 5), $Nd_2O_3$, $Sm_2O_3$, $EuO_y$ (wherein y=1 to 5), $Gd_2O_3$, $Dy_2O_3$, $Ho_2O_3$, $Er_2O_3$, $Tm_2O_3$, $Yb_2O_3$, and $Lu_2O_3$.

The dielectric layer 12 may be formed using, for example, a chemical vapor deposition process, an organometallic chemical vapor deposition process, a molecular beam epitaxy process, a vapor phase epitaxy process, a liquid phase epitaxy process, a sol-gel process, a sputtering process, a pulsed laser deposition process, an atomic layer deposition process, and/or the like.

When the dielectric layer 12 is formed using a molecular beam epitaxy process, for example, after an insulating substrate 100 on which the first thin electrode 11 that is surface-treated is formed is loaded into a reaction chamber, the first thin-film electrode 11 may be maintained at a temperature of about 400° C. to about 800° C., and a partial pressure of an oxidant, for example, an oxygen partial pressure may be maintained at about $10^{-8}$ Torr to about $10^{-5}$ Torr in the chamber. A gaseous metal for forming an interlayer may be supplied by sublimating the metal from a metal precursor. Subsequently, a gaseous metal is provided onto the surface-treated first electrode 11, and then an oxidant may be supplied to form the interlayer (not shown) on the surface-treated first thin-film electrode 11. When the dielectric layer 12 includes a $TiO_2$ layer, the metal precursor may consist of a precursor compound including titanium or titanium, and the oxidant may include oxygen ($O_2$), ozone ($O_3$), nitrogen dioxide ($NO_2$), or dinitrogen dioxide ($N_2O$). The oxidant may be, for example, oxygen.

When the dielectric layer 12 is formed using a chemical vapor deposition process, an insulating substrate 100 on which a first electrode 11 that is surface-treated is formed may be loaded in a reaction chamber, and the reaction chamber may be maintained at a temperature of about 500° C. to about 600° C. and a pressure of about 1 Torr and about 10 Torr. Subsequently, an organic metal precursor is provided onto the surface-treated first electrode 11, and then an oxidant is supplied to form the electric layer 12 on the surface-treated first electrode 11. When the dielectric layer 12 includes $TiO_2$, the organic metal precursor may consist of a precursor compound including titanium or titanium, and the oxidant may include oxygen ($O_2$), ozone ($O_3$), nitrogen dioxide ($NO_2$), or dinitrogen dioxide ($N_2O$). For example, the oxidant may include oxygen.

The materials constituting the dielectric layer 12 may be additionally crystalized by performing a heat treatment process on the dielectric layer 12. For example, the dielectric layer 12 is heat-treated by a rapid heat treatment process (RTP) under an atmosphere of oxygen ($O_2$) gas, nitrogen ($N_2$) gas, argon (Ar) gas, ammonia ($NH_4$) gas, or a mixture thereof. The RTP may be performed, for example, at a temperature of about 500° C. to about 650° C. for about 30 seconds to about 3 minutes.

In other example embodiments, the dielectric layer 12 may be formed by heat-treating a coating film obtained by coating and drying a dielectric paste including the dielectric described above.

The coating method may, e.g., not use a vacuum process or a high-temperature process, and thus it is possible to simply manufacture the dielectric layer 12.

The dielectric paste includes the dielectric described above, an organic component, and a solvent. The dielectric paste includes dielectric particles. The organic component may be embedded in the voids between the dielectric particles to prevent a short circuit of a capacitor and improve the production yield of the capacitor.

Examples of the organic component include a monomer, an oligomer, a polymer, a photopolymerization initiator, a plasticizer, a leveling agent, a surfactant, a silane coupling agent, a defoamer, a pigment, and a dispersant. In view of improving the bending resistance of the capacitor, for example, the organic component may be an oligomer or a polymer. The oligomer or polymer may be, for example, a thermoplastic resin, a thermosetting resin, or the like. Examples of the oligomer or polymer include acrylic resin, epoxy resin, novolak resin, phenol resin, polyimide precursor resin, polyimide resin, polysiloxane resin, fluoride-based resin, polyvinyl acetal resin, and/or the like.

A solvent may be used as long as it disperses the dielectric particles and dissolves the organic component. Examples of the solvent include organic solvents, including: ketone-based solvents such as methyl ethyl ketone, acetone, diethyl ketone, methyl isobutyl ketone, methyl isopropyl ketone, cyclopentanone, and cyclohexanone; alcohol-based solvents such as methanol, ethanol, isopropanol, isobutyl alcohol, benzyl alcohol, methoxymethylbutanol, ethylene glycol, diethylene glycol, and glycerin; ether-based solvents such as diethyl ether, diisopropyl ether, 1,2-dimethoxyethane, 1,4-dioxane, tetrahydrofuran, tetrahydropyran, anisole, diethylene glycol dimethyl ether (diglyme), and diethylene glycol ethyl ether (carbitol); cellosolve-based solvents such as methyl cellosolve, ethyl cellosolve, and phenyl cellosolve; aliphatic hydrocarbon-based solvents such as hexane, pentane, heptane, and cyclohexane; aromatic hydrocarbon-based solvents such as toluene, xylene, and benzene; aromatic heterocyclic compound solvents such as pyridine, pyrazine, furan, pyrrole, thiophene, and N-methylpyrrolidone; amide-based solvents such as N, N-dimethylformamide and N, N-dimethylacetamide; halogen compound-based solvents such as trichloroethylene, dichloromethane, chloroform, 1,2-dichloroethane, and chlorobenzene; ester-based solvents such as ethyl acetate, methyl acetate, ethyl formate, ethyl lactate, dimethyl carbonate, diethyl carbonate, propylene carbonate, and γ-butyrolactone; sulfur compound-based solvents such as dimethyl sulfoxide and sulfolane; nitrile-based solvents such as acetonitrile, propionitrile, and acrylonitrile; organic acid-based solvents such as formic acid, acetic acid, trichloroacetic acid, and trifluoroacetic acid; mixed solvents thereof; and/or the like.

Examples of the coating method include spin coating, blade coating, slit die coating, screen printing, bar coating, casting, gravure printing, flexographic printing, offset printing, dip coating, inkjet printing, and dispensing. Among these coating methods, in view of pattern workability and film formability, for example, screen printing, gravure printing, flexographic printing, offset printing, inkjet printing, dispensing, and/or the like may be used.

A method of removing a solvent from a coating film may be, for example, heat drying or vacuum drying using an oven, a hot plate, or infrared light, and, for example, may be performed at a temperature of about 50° C. to about 140° C. for about 1 minute to about several hours.

Next, in order to improve dielectric characteristics, the coating film may be cured. The curing temperature is selected depending on the kind of a dielectric compound, a solvent used, and the kind of a substrate. For example, when the organic component in the dielectric paste is an acrylic resin, in view of heat resistance, the curing temperature may be in a range of about 50° C. to about 300° C. Further, when the insulating substrate is polyethylene terephthalate, in view of preventing deterioration in processing accuracy due to thermal expansion of the substrate, the curing temperature may be kept within a range of about 50° C. to about 150° C. As the curing method, heat curing or vacuum curing using an oven, a hot plate or infrared light, curing using a xenon flash lamp, and photocuring using UV light may be used.

In order to increase the flatness of the dielectric layer, it is possible to form a planarization layer on the coating film obtained by coating and drying the dielectric paste. The material of the planarization layer may be a known resin such as a polyimide resin, a polysiloxane resin, an acrylic resin, or an epoxy resin. For example, in view of dielectric characteristics, the thickness of the planarization layer may be smaller than the thickness of the dielectric layer.

The dielectric layer may be patterned or not patterned. In view of preventing misreading by reducing crosstalk between dielectric elements, the dielectric layer may be patterned. As the patterning method, for example, in view of fine processing, photolithography processing in which the organic component includes a photosensitive organic component may be used. When the photolithography processing is used, it may be possible to highly integrate dielectric elements.

Next, the other thin-film electrode layer is arranged on the dielectric layer 12 to provide the capacitor 20.

A method of arranging another thin-film electrode layer may be the same as the method of arranging the first thin-film electrode 11 or the second thin-film electrode 13.

When the first thin-film electrode 11 is arranged first, the second thin-film electrode 13 is arranged on the dielectric layer 12. When the second thin-film electrode 13 is arranged first, the first thin-film electrode 11 is arranged on the dielectric layer 12.

By the arrangement of the second thin-film electrode 13 or the first thin-film electrode 11 on the dielectric layer 12, the capacitor 20 is prepared.

Hereinafter, the present disclosure will be described in more detail with reference the following examples and comparative examples. However, these examples are only for illustrative purposes and are not intended to limit the scope of the present disclosure.

(Manufacture of Dielectric Layer)

Example 1: Metal Oxide Electrode, $[AlO_2]^-$ Anionized Layer, 1 Unit Cell

On a (110) plane of a $RuO_2$ first thin-film electrode having a thickness of 1000 Å, a $[AlO_2]^-$ anionized layer was grown in the [110] direction using molecular beam epitaxy (MBE) to form an interlayer.

The interlayer is represented by $AlO_x$ (wherein $1.5<x\leq2.0$) as a compound. The interlayer including 1 unit cell had a thickness of 3.1 Å. MBE was performed at an oxygen partial pressure of $5\times10^{-8}$ to $8\times10^{-8}$ Torr, and the temperature of the first thin-film electrode was 700° C.

A $TiO_2$ dielectric layer having a rutile structure was grown on the $AlO_x$ interlayer to a thickness of 100 Å by the same method.

A $RuO_2$ second thin-film electrode having a thickness of 200 Å was formed on the $TiO_2$ dielectric layer by the same method, to thereby manufacture a capacitor.

Example 2: Metal Oxide Electrode, $[GaO_2]^-$ Anionized Layer, 1 Unit Cell

A capacitor was manufactured in the same manner as in Example 1, except that a $[GaO_2]^-$ anionized layer was formed instead of the $[AlO_2]^-$ anionized layer.

Example 3: Metal Oxide Electrode, $[BeO_2]^{-2}$ Anionized Layer, 1 Unit Cell A capacitor was manufactured in the same manner as in Example 1, except that a $[BeO_2]^{-2}$ anionized layer was formed instead of the $[AlO_2]^-$ anionized layer.

Example 4: Metal Oxide Electrode, $[MgO_2]^{-2}$ Anionized Layer, 1 Unit Cell A capacitor was manufactured in the same manner as in Example 1, except that a $[MgO_2]^{-2}$ anionized layer was formed instead of the $[AlO_2]^-$ anionized layer.

Example 5: Metal Oxide Electrode, $[LiO_2]^{-3}$ Anionized Layer, 1 Unit Cell A capacitor was manufactured in the same manner as in Example 1, except that a $[LiO_2]^{-3}$ anionized layer was formed instead of the $[AlO_2]^-$ anionized layer.

Comparative Example 1: Metal Oxide Electrode, $[SiO_2]$ Neutral Layer, 1 Unit Cell A capacitor was manufactured in the same manner as in Example 1, except that a $[SiO_2]$ neutral layer was formed instead of the $[AlO_2]^-$ anionized layer.

Comparative Example 2: Metal Oxide Electrode, $[GeO_2]$ Neutral Layer, 1 Unit Cell A capacitor was manufactured in the same manner as in Example 1, except that a $[GeO_2]$ neutral layer was formed instead of the $[AlO_2]^-$ anionized layer.

Comparative Example 3: Metal Oxide Electrode, Neutral Layer-Free

A capacitor was manufactured in the same manner as in Example 1, except that the step of introducing the interlayer was omitted.

Example 6: Metal Electrode, $[AlO_2]^-$ Anionized Layer, 1 Unit Cell

On a (001) plane of a Pt first thin-film electrode having a thickness of 1000 Å, a $[AlO_2]^-$ anionized layer was grown in the [001] direction using molecular beam epitaxy (MBE) to form an interlayer.

The interlayer is represented by $AlO_x$ (wherein $1.5<x\leq2.0$) as a compound. The interlayer including 1 unit cell had a thickness of 1.7 Å. MBE was performed at an oxygen partial pressure of $5\times10^{-8}$ to $8\times10^{-8}$ Torr, and the temperature of the first thin-film electrode was 700° C.

A $TiO_2$ dielectric layer having a rutile structure was grown on the $AlO_x$ interlayer to a thickness of 100 Å by the same method.

A Pt second thin-film electrode having a thickness of 200 Å was formed on the $TiO_2$ dielectric layer by the same method, to thereby manufacture a capacitor.

Example 7: Metal Electrode, $[GaO_2]^-$ Anionized Layer, 1 Unit Cell

A capacitor was manufactured in the same manner as in Example 6, except that a $[GaO_2]^-$ anionized layer was formed instead of the $[AlO_2]^-$ anionized layer.

Example 8: Metal Electrode, $[BeO_2]^{-2}$ Anionized Layer, 1 Unit Cell

A capacitor was manufactured in the same manner as in Example 6, except that a $[BeO_2]^{-2}$ anionized layer was formed instead of the $[AlO_2]^-$ anionized layer.

Example 9: Metal Electrode, $[MgO_2]^{-2}$ Anionized Layer, 1 Unit Cell

A capacitor was manufactured in the same manner as in Example 6, except that a $[MgO_2]^{-2}$ anionized layer was formed instead of the $[AlO_2]^-$ anionized layer.

Example 10: Metal Electrode, $[LiO_2]^{-3}$ Anionized Layer, 1 Unit Cell

A capacitor was manufactured in the same manner as in Example 6, except that a $[LiO_2]^{-3}$ anionized layer was formed instead of the $[AlO_2]^-$ anionized layer.

Comparative Example 4: Metal Electrode, $[SiO_2]$ Neutral Layer, 1 Unit Cell

A capacitor was manufactured in the same manner as in Example 6, except that a $[SiO_2]$ neutral layer was formed instead of the $[AlO_2]^-$ anionized layer.

Comparative Example 5: Metal Electrode, Interlayer-Free

A capacitor was manufactured in the same manner as in Example 6, except that the step of introducing the interlayer was omitted.

Example 11: Doped Metal Oxide Electrode, $[AlO_2]^-$ Anionized Layer, 1 Unit Cell On a (110) plane of a Ta-doped $SnO_2$ first thin-film electrode having a thickness of 1000 Å, a $[AlO_2]^-$ anionized layer was grown in the [110] direction using molecular beam epitaxy (MBE) to form an interlayer.

The interlayer is represented by $AlO_x$ (wherein $1.5<x\leq2.0$) as a compound. The interlayer including 1 unit cell had a thickness of 3.1 Å. MBE was performed at an oxygen partial pressure of $5\times10^{-8}$ to $8\times10^{-8}$ Torr, and the temperature of the first thin-film electrode was 700° C.

A $TiO_2$ dielectric layer was grown on the $AlO_x$ interlayer to a thickness of 100 Å by the same method.

A Ta-doped $SnO_2$ second thin-film electrode having a thickness of 200 Å was formed on the $TiO_2$ dielectric layer by the same method, to thereby manufacture a capacitor.

Example 12: Doped Metal Oxide Electrode, $[GaO_2]^-$ Anionized Layer, 1 Unit Cell A capacitor was manufactured in the same manner as in Example 11, except that a $[GaO_2]^-$ anionized layer was formed instead of the $[AlO_2]^-$ anionized layer.

Example 13: Doped Metal Oxide Electrode, $[BO_2]^-$ Anionized Layer, 1 Unit Cell A capacitor was manufactured in the same manner as in Example 11, except that a $[BaO_2]^-$ anionized layer was formed instead of the $[AlO_2]^-$ anionized layer.

Example 14: Doped Metal Oxide Electrode, $[BeO_2]^{-2}$ Anionized Layer, 1 Unit Cell A capacitor was manufactured in the same manner as in Example 11, except that a $[BeO_2]^{-2}$ anionized layer was formed instead of the $[AlO_2]^-$ anionized layer.

Example 15: Doped Metal Oxide Electrode, $[MgO_2]^{-2}$ Anionized Layer, 1 Unit Cell A capacitor was manufactured in the same manner as in Example 11, except that a $[MgO_2]^{-2}$ anionized layer was formed instead of the $[AlO_2]^-$ anionized layer.

Example 16: Doped Metal Oxide Electrode, $[LiO_2]^{-3}$ Anionized Layer, 1 Unit Cell A capacitor was manufactured in the same manner as in Example 11, except that a $[LiO_2]^{-3}$ anionized layer was formed instead of the $[AlO_2]^-$ anionized layer.

Comparative Example 6: Doped Metal Oxide Electrode, $[SiO_2]$ Neutral Layer, 1 Unit Cell A capacitor was manufactured in the same manner as in Example 11, except that a $[SiO_2]$ neutral layer was formed instead of the $[AlO_2]^-$ anionized layer.

Comparative Example 7: Doped Metal Oxide Electrode, $[GeO_2]$ Neutral Layer, 1 Unit Cell A capacitor was manufactured in the same manner as in Example 11, except that a $[GeO_2]$ neutral layer was formed instead of the $[AlO_2]^-$ anionized layer.

Comparative Example 8: Doped Metal Oxide Electrode, $[HfO_2]$ Neutral Layer, 1 Unit Cell A capacitor was manufactured in the same manner as in Example 11, except that a $[HfO_2]$ neutral layer was formed instead of the $[AlO_2]^-$ anionized layer.

Comparative Example 9: Doped Metal Oxide Electrode, $[ZrO_2]$ Neutral Layer, 1 Unit Cell A capacitor was manufactured in the same manner as in Example 11, except that a $[HfO_2]$ neutral layer was formed instead of the $[AlO_2]^-$ anionized layer.

Comparative Example 10: Doped Metal Oxide Electrode, Interlayer-Free

A capacitor was manufactured in the same manner as in Example 11, except that the step of introducing the interlayer was omitted.

Example 17: Metal Nitride Electrode (I), $[AlO_2]^-$ Anionized Layer, 1 Unit Cell On a (001) plane of a TiN first thin-film electrode having a thickness of 1000 Å, a $[AlO_2]^-$ anionized layer was grown in the [001] direction using molecular beam epitaxy (MBE) to form an interlayer.

The interlayer is represented by $AlO_x$ (wherein $1.5<x\leq2.0$) as a compound. The interlayer including 1 unit cell had a thickness of 2.5 Å. MBE was performed at an oxygen partial pressure of $5\times10^{-8}$ to $8\times10^{-8}$ Torr, and the temperature of the first thin-film electrode was 700° C.

A $ZrO_2$ dielectric layer having a tetragonal structure was grown on the $AlO_x$ interlayer to a thickness of 100 Å by the same method.

A TiN second thin-film electrode having a thickness of 200 Å was formed on the $TiO_2$ dielectric layer by the same method, to thereby manufacture a capacitor.

Example 18: Metal Nitride Electrode, $[GaO_2]^-$ Anionized Layer, 1 Unit Cell

A capacitor was manufactured in the same manner as in Example 17, except that a $[GaO_2]^-$ anionized layer was formed instead of the $[AlO_2]^-$ anionized layer.

Example 19: Metal Nitride Electrode, $[BO_2]^-$ Anionized Layer, 1 Unit Cell

A capacitor was manufactured in the same manner as in Example 17, except that a $[BO_2]^-$ anionized layer was formed instead of the $[AlO_2]^-$ anionized layer.

Example 20: Metal Nitride Electrode, $[BeO_2]^{-2}$ Anionized Layer, 1 Unit Cell A capacitor was manufactured in the same manner as in Example 17, except that a $[BeO_2]^{-2}$ anionized layer was formed instead of the $[AlO_2]^-$ anionized layer.

Example 21: Metal Nitride Electrode, $[MgO_2]^{-2}$ Anionized Layer, 1 Unit Cell A capacitor was manufactured in the same manner as in Example 17, except that a $[MgO_2]^{-2}$ anionized layer was formed instead of the $[AlO_2]^-$ anionized layer.

Example 22: Metal Nitride Electrode, $[LiO_2]^{-3}$ Anionized Layer, 1 Unit Cell A capacitor was manufactured in the same manner as in Example 17, except that a $[LiO_2]^{-3}$ anionized layer was formed instead of the $[AlO_2]^-$ anionized layer.

Comparative Example 11: Metal Nitride Electrode, $[SiO_2]$ Neutral Layer, 1 Unit Cell A capacitor was manufactured in the same manner as in Example 17, except that a $[SiO_2]$ neutral layer was formed instead of the $[AlO_2]^-$ anionized layer.

Comparative Example 12: Metal Nitride Electrode, $[HfO_2]$ Neutral Layer, 1 Unit Cell A capacitor was manufactured in the same manner as in Example 17, except that a $[HfO_2]$ neutral layer was formed instead of the $[AlO_2]^-$ anionized layer.

Comparative Example 13: Metal Nitride Electrode, Interlayer-Free

A capacitor was manufactured in the same manner as in Example 17, except that the step of introducing the interlayer was omitted.

Example 23: Metal Nitride Electrode (II), $[AlO_2]^-$ Anionized Layer, 1 Unit Cell On a (001) plane of a TiN first thin-film electrode having a thickness of 1000 Å, a $[AlO_2]^-$ anionized layer was grown in the [001] direction using molecular beam epitaxy (MBE) to form an interlayer.

The interlayer is represented by $AlO_x$ (wherein $1.5<x\leq2.0$) as a compound. The interlayer including 1 unit cell had a thickness of 2.5 Å. MBE was performed at an oxygen partial pressure of $5\times10^{-8}$ to $8\times10^{-8}$ Torr, and the temperature of the first thin-film electrode was 700° C.

A $HfO_2$ dielectric layer having a tetragonal structure was grown on the $AlO_x$ interlayer to a thickness of 100 Å by the same method.

A TiN second thin-film electrode having a thickness of 200 Å was formed on the $TiO_2$ dielectric layer by the same method, to thereby manufacture a capacitor.

Example 24: Metal Nitride Electrode, $[GaO_2]^-$ Anionized Layer, 1 Unit Cell

A capacitor was manufactured in the same manner as in Example 23, except that a $[GaO_2]^-$ anionized layer was formed instead of the $[AlO_2]^-$ anionized layer.

Example 25: Metal Nitride Electrode, $[BO_2]^-$ Anionized Layer, 1 Unit Cell

A capacitor was manufactured in the same manner as in Example 23, except that a $[BO_2]^-$ anionized layer was formed instead of the $[AlO_2]^-$ anionized layer.

Example 26: Metal Nitride Electrode, $[BeO_2]^{-2}$ Anionized Layer, 1 Unit Cell A capacitor was manufactured in the same manner as in Example 23, except that a $[BeO_2]^{-2}$ anionized layer was formed instead of the $[AlO_2]^-$ anionized layer.

Example 27: Metal Nitride Electrode, $[MgO_2]^{-2}$ Anionized Layer, 1 Unit Cell A capacitor was manufactured in the same manner as in Example 23, except that a $[MgO_2]^{-2}$ anionized layer was formed instead of the $[AlO_2]^-$ anionized layer.

Example 28: Metal Nitride Electrode, $[LiO_2]^{-3}$ Anionized Layer, 1 Unit Cell A capacitor was manufactured in the same manner as in Example 23, except that a $[LiO_2]^{-3}$ anionized layer was formed instead of the $[AlO_2]^-$ anionized layer.

Comparative Example 14: Metal Nitride Electrode, $[SiO_2]$ Neutral Layer, 1 Unit Cell A capacitor was manufactured in the same manner as in Example 23, except that a $[SiO_2]$ neutral layer was formed instead of the $[AlO_2]^-$ anionized layer.

Comparative Example 15: Metal Nitride Electrode, $[ZrO_2]$ Neutral Layer, 1 Unit Cell A capacitor was manufactured in the same manner as in Example 23, except that a $[HfO_2]$ neutral layer was formed instead of the $[AlO_2]^-$ anionized layer.

Comparative Example 16: Metal Nitride Electrode, Interlayer-Free

A capacitor was manufactured in the same manner as in Example 23, except that the step of introducing the interlayer was omitted.

Example 29: Metal Oxide Electrode, $[AlO_2]^-$ Anionized Layer, 1 Unit Cell

On a (110) plane of a $RuO_2$ first thin-film electrode having a thickness of 1000 Å, a $[AlO_2]^-$ anionized layer was grown in the [110] direction using molecular beam epitaxy (MBE) to form an interlayer.

The interlayer is represented by $AlO_x$ (wherein $1.5<x\leq 2.0$) as a compound. The interlayer including 1 unit cell had a thickness of 3.1 Å. MBE was performed at an oxygen partial pressure of $5\times10^{-8}$ to $8\times10^{-8}$ Torr, and the temperature of the first thin-film electrode was 700° C.

A $TiO_2$ dielectric layer having a rutile structure was grown on the $AlO_x$ interlayer to a thickness of 100 Å by the same method.

A $RuO_2$ second thin-film electrode having a thickness of 200 Å was formed on the $TiO_2$ dielectric layer by the same method, to thereby manufacture a capacitor.

Example 30: Metal Oxide Electrode, $[AlO_2]^-$ Anionized Layer, 2 Unit Cells

A capacitor was manufactured in the same manner as in Example 29, except that the thickness of the interlayer was increased to 2 unit cells.

Example 31: Metal Oxide Electrode, $[AlO_2]^-$ Anionized Layer, 3 Unit Cells

A capacitor was manufactured in the same manner as in Example 29, except that the thickness of the interlayer was increased to 3 unit cells.

Example 32: Metal Oxide Electrode, $[GaO_2]^-$ Anionized Layer, 1 Unit Cell

A capacitor was manufactured in the same manner as in Example 29, except that a $[GaO_2]^-$ anionized layer was formed instead of the $[AlO_2]^-$ anionized layer.

Example 33: Metal Oxide Electrode, $[GaO_2]^-$ Anionized Layer, 2 Unit Cells

A capacitor was manufactured in the same manner as in Example 32, except that the thickness of the interlayer was increased to 2 unit cells.

Example 34: Metal Oxide Electrode, $[GaO_2]^-$ Anionized Layer, 3 Unit Cells

A capacitor was manufactured in the same manner as in Example 33, except that the thickness of the interlayer was increased to 3 unit cells.

Comparative Example 17: Metal Nitride Electrode, Interlayer-Free

A capacitor was manufactured in the same manner as in Example 29, except that the step of introducing the interlayer was omitted.

Evaluation Example 1: Schottky Barrier Height (SBH) Calculation, Metal Oxide Electrode/Anionized Layer/Dielectric Layer An amount of change (ΔV) of the Schottky barrier height (SBH) of a laminate, in which a first anionized layer is arranged as the interlayer between $RuO_2$ and $TiO_2$, with respect to a laminate of $RuO_2$ (electrode)/$TiO_2$ (dielectric) was calculated, and some of the results are shown in Table 1.

Figure 1B:
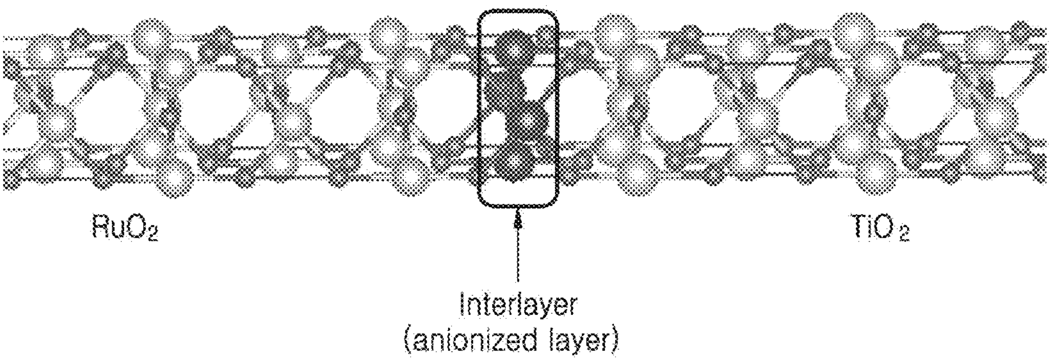
FIG. 1B shows a schematic view showing a magnified structure of an interlayer portion of a capacitor including an interlayer, according to some example embodiments.

Referring to FIGS. 1A and 1B, the anionized layer is arranged as the interlayer between $RuO_2$ and $TiO_2$.

A dielectric constant and a bandgap were calculated in the framework of the density functional theory (DFT) using the Vienna Ab initio simulation package (VASP).

The Schottky barrier height (SBH) of a laminate with the interlayer arranged therein is represented by Equation 1.

$$SBH=\phi-\chi+\Delta V \quad \text{<Equation 1>}$$

In Expression 1, $\phi$ is the work function of the electrode, $\chi$ is the electron affinity of the dielectric, and ΔV is the amount of change in SBH.

TABLE 11

| | Interlayer | Cation of Interlayer | Amount of change in SBH [eV] |
|---|---|---|---|
| Example 1 | $[AlO_2]^-$ | $Al^{+3}$ | 1.05 |
| Example 2 | $[GaO_2]^-$ | $Ga^{+3}$ | 1.03 |
| Example 3 | $[BeO_2]^{-2}$ | $Be^{+2}$ | 1.00 |
| Example 4 | $[MgO_2]^{-2}$ | $Mg^{+2}$ | 1.21 |
| Example 5 | $[LiO_2]^{-3}$ | $Li^+$ | 1.22 |
| Comparative Example 1 | $[SiO_2]$ | $Si^{+4}$ | −0.36 |
| Comparative Example 2 | $[GeO_2]$ | $Ge^{+4}$ | −0.26 |
| Comparative Example 3 | — | — | 0 |

As shown in Table 1, in the capacitors of Examples 1 to 5, by the arrangement of the anodized layer as the interlayer between the metal oxide electrode and the dielectric layer, the laminate including the interlayer had an increased SBH.

Without being limited to a particular theory, this increase in the Schottky barrier height is considered to be because the anionized layer induced screening charge having an opposite polarity to the corresponding electrode, and thus led to an additional electrostatic potential difference between the electrode and the dielectric layer.

Accordingly, it was confirmed that the anionized layer arranged as the interlayer between the electrode and the dielectric layer is suitable as a leakage current blocking layer for the capacitor.

Meanwhile, in the same structure as the capacitors of Comparative Examples 1 to 2, by the arrangement of the neutral layer as the interlayer between the metal oxide electrode and the dielectric layer, the SHB of the laminate including the interlayer was rather reduced.

Evaluation Example 2: Schottky Barrier Height (SBH) Calculation, Metal Electrode/Anionized Layer/Dielectric Layer An amount of change (ΔV) of the SBH of a laminate, in which an anionized layer is arranged as the interlayer between Pt and $TiO_2$, with respect to a laminate of Pt (electrode)/$TiO_2$ (dielectric) was calculated, and some of the results are shown in Table 2.

Figure 2A:
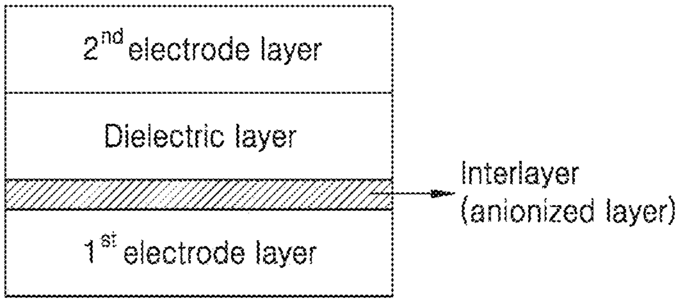
FIG. 2A shows a schematic view of a capacitor including an interlayer, according to some example embodiments.
Figure 2B:
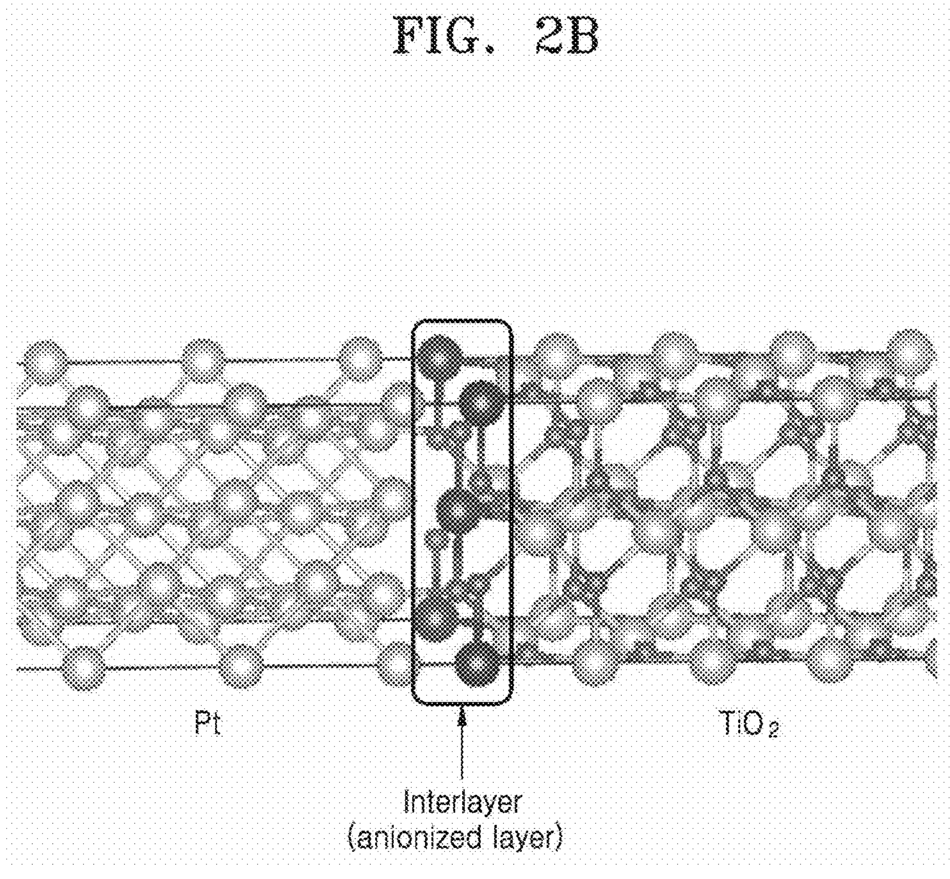
FIG. 2B shows a schematic view showing a magnified structure of an interlayer portion of a capacitor including an interlayer, according to some example embodiments.

Referring to FIGS. 2A and 2B, the anionized layer is arranged as the interlayer between Pt and $TiO_2$.

The calculation method was the same as in Evaluation Example 1.

TABLE 2

| | Interlayer | Cation of Interlayer | Amount of change in SBH [eV] |
|---|---|---|---|
| Example 6 | $[AlO_2]^-$ | $Al^{+3}$ | 0.54 |
| Example 7 | $[GaO_2]^-$ | $Ga^{+3}$ | 0.60 |
| Example 8 | $[BeO_2]^{-2}$ | $Be^{+2}$ | 0.58 |
| Example 9 | $[MgO_2]^{-2}$ | $Mg^{+2}$ | 1.13 |
| Example 10 | $[LiO_2]^{-3}$ | $Li^+$ | 1.34 |
| Comparative Example 4 | $[SiO_2]$ | $Si^{+4}$ | −0.50 |
| Comparative Example 5 | — | — | 0 |

As shown in Table 2, in the capacitors of Examples 6 to 10, by the arrangement of the anodized layer as the interlayer between the metal electrode and the dielectric layer, the laminate including the interlayer had an increased SBH. Without being limited to a particular theory, this increase in the Schottky barrier height is considered to be because the anionized layer induced screening charge having an opposite polarity to the corresponding electrode, and thus led to an additional electrostatic potential difference between the electrode and the dielectric layer.

Accordingly, it was confirmed that the anionized layer arranged as the interlayer between the electrode and the dielectric layer is suitable as a leakage current blocking layer for the capacitor.

Meanwhile, in the capacitor of Comparative Example 4, by the arrangement of the neutral layer as the interlayer between the electrode and the dielectric layer, the SHB of the laminate including the interlayer was rather reduced.

Evaluation Example 3: Schottky Barrier Height (SBH) Calculation, Doped Metal Oxide Electrode/Anionized Layer/Dielectric Layer An amount of change (ΔV) of the SBH of a laminate, in which an anionized layer is arranged as the interlayer between Ta-doped $SnO_2$ and $TiO_2$, with respect to a laminate of Ta-doped $SnO_2$ (electrode)/$TiO_2$ (dielectric) was calculated, and some of the results are shown in Table 3.

Figure 3A:
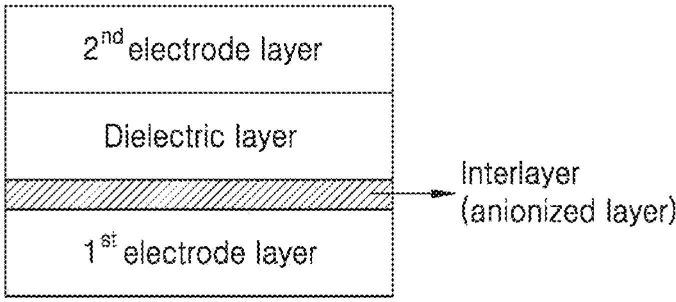
FIG. 3A shows a schematic view of a capacitor including an interlayer, according to some example embodiments.
Figure 3B:
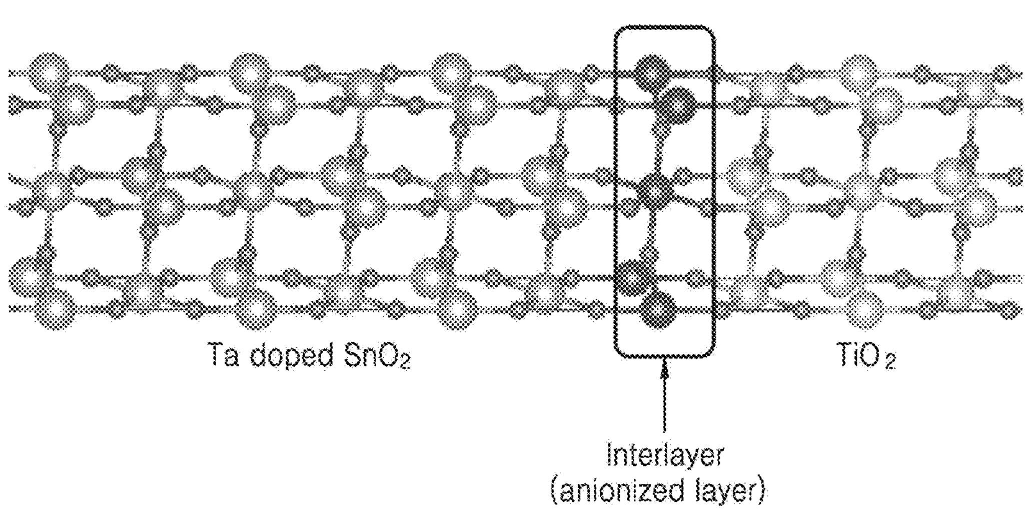
FIG. 3B shows a schematic view showing a magnified structure of an interlayer portion of a capacitor including an interlayer, according to some example embodiments.

Referring to FIGS. 3A and 3B, the anionized layer is arranged as the interlayer between Ta-doped $SnO_2$ and $TiO_2$.

The calculation method was the same as in Evaluation Example 1.

TABLE 3

| | Interlayer | Cation of Interlayer | Amount of change in SBH [eV] |
|---|---|---|---|
| Example 11 | $[AlO_2]^-$ | $Al^{+3}$ | 1.54 |
| Example 12 | $[GaO_2]^-$ | $Ga^{+3}$ | 1.51 |
| Example 13 | $[BO_2]^-$ | $B^{+3}$ | 1.28 |
| Example 14 | $[BeO_2]^{-2}$ | $Be^{+2}$ | 1.52 |
| Example 15 | $[MgO_2]^{-2}$ | $Mg^{+2}$ | 1.33 |
| Example 16 | $[LiO_2]^{-3}$ | $Li^+$ | 1.26 |
| Comparative Example 6 | $[SiO_2]$ | $Si^{+4}$ | 0.12 |
| Comparative Example 7 | $[GeO_2]$ | $Ge^{+4}$ | 0.28 |
| Comparative Example 8 | $[HfO_2]$ | $Hf^{+4}$ | 0.18 |
| Comparative Example 9 | $[ZrO_2]$ | $Zr^{+4}$ | 0.03 |
| Comparative Example 10 | — | — | 0 |

As shown in Table 3, in the capacitors of Examples 11 to 16, by the arrangement of the anodized layer as the interlayer between the metal electrode and the dielectric layer, the SBH of the laminate including the interlayer was increased by 1 eV or more. Without being limited to a particular theory, this increase in the Schottky barrier height is considered to be because the anionized layer induced screening charge having an opposite polarity to the corresponding electrode, and thus led to an additional electrostatic potential difference between the electrode and the dielectric layer.

Accordingly, it was confirmed that the anionized layer arranged as the interlayer between the electrode and the dielectric layer is suitable as a leakage current blocking layer for the capacitor.

Meanwhile, in the capacitors of Comparative Examples 6 to 9, by the arrangement of the neutral layer as the interlayer between the electrode and the dielectric layer, an increase in the SHB of the laminate including the interlayer was less than 0.5 eV.

Evaluation Example 4: Schottky Barrier Height (SBH) Calculation, Metal Nitride Electrode(I)/Anionized Layer/Dielectric Layer An amount of change (ΔV) of the SBH of a laminate, in which an anionized layer is arranged as the interlayer between TiN and $ZrO_2$, with respect to a laminate of TiN (electrode)/$ZrO_2$ (dielectric) was calculated, and some of the results are shown in Table 4.

Figure 4A:
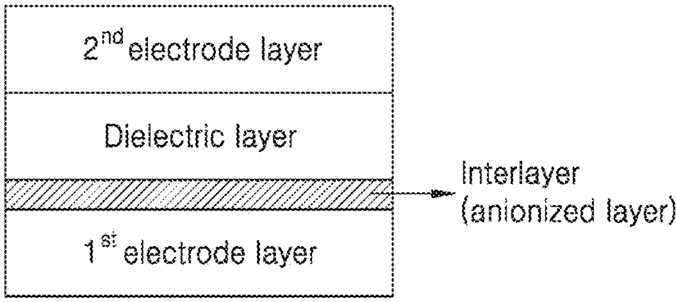
FIG. 4A shows a schematic view of a capacitor including an interlayer, according to some example embodiments.
Figure 4B:
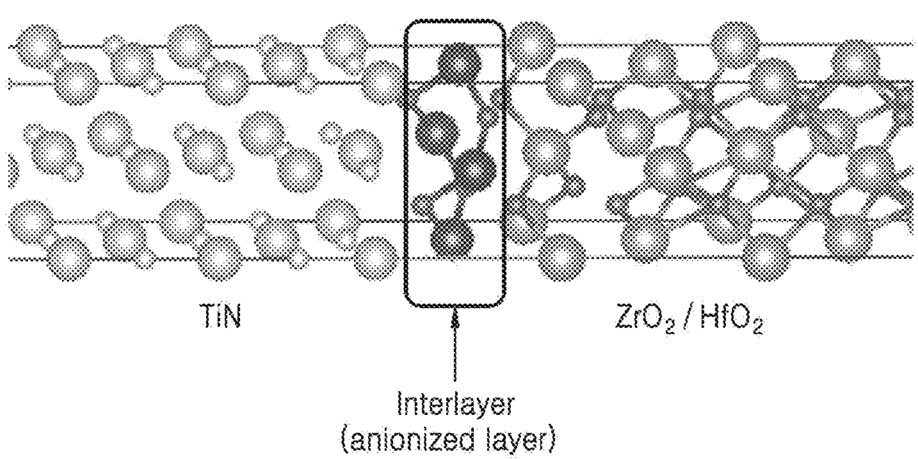
FIG. 4B shows a schematic view showing a magnified structure of an interlayer portion of a capacitor including an interlayer, according to some example embodiments.

Referring to FIGS. 4A and 4B, the anionized layer is arranged as the interlayer between TiN and $ZrO_2$.

The calculation method was the same as in Evaluation Example 1.

TABLE 4

| | Interlayer | Cation of Interlayer | Amount of change in SBH [eV] |
|---|---|---|---|
| Example 17 | $[AlO_2]^-$ | $Al^{+3}$ | 2.30 |
| Example 18 | $[GaO_2]^-$ | $Ga^{+3}$ | 3.00 |
| Example 19 | $[BO_2]^-$ | $B^{+3}$ | 2.02 |
| Example 20 | $[BeO_2]^{-2}$ | $Be^{+2}$ | 3.13 |
| Example 21 | $[MgO_2]^{-2}$ | $Mg^{+2}$ | 3.43 |
| Example 22 | $[LiO_2]^{-3}$ | $Li^+$ | 3.50 |
| Comparative Example 11 | $[SiO_2]$ | $Si^{+4}$ | 0.0 |

TABLE 4-continued

| | Interlayer | Cation of Interlayer | Amount of change in SBH [eV] |
|---|---|---|---|
| Comparative Example 12 | $[HfO_2]$ | $Hf^{+4}$ | −0.24 |
| Comparative Example 13 | — | — | 0 |

As shown in Table 4, in the capacitors of Examples 17 to 22, by the arrangement of the anodized layer as the interlayer between the metal electrode and the dielectric layer, the laminate including the interlayer had an increased SBH. Without being limited to a particular theory, this increase in the Schottky barrier height is considered to be because the anionized layer induced screening charge having an opposite polarity to the corresponding electrode, and thus led to an additional electrostatic potential difference between the electrode and the dielectric layer.

Accordingly, it was confirmed that the anionized layer arranged as the interlayer between the electrode and the dielectric layer is suitable as a leakage current blocking layer for the capacitor.

Meanwhile, in the capacitors of Comparative Examples 11 and 12, by the arrangement of the neutral layer as the interlayer between the electrode and the dielectric layer, the SHB of the laminate including the interlayer had no change or was rather reduced.

Evaluation Example 5: Schottky Barrier Height (SBH) Calculation, Metal Nitride Electrode(II)/Anionized Layer/Dielectric Layer An amount of change (ΔV) of the SBH of a laminate, in which an anionized layer is arranged as the interlayer between TiN and $hfO_2$, with respect to a laminate of TiN (electrode)/$HfO_2$ (dielectric) was calculated, and some of the results are shown in Table 5.

Referring to FIGS. 4A and 4B, the anionized layer is arranged as the interlayer between TiN and $HfO_2$.

The calculation method was the same as in Evaluation Example 1.

TABLE 5

| | Interlayer | Cation of Interlayer | Amount of change in SBH [eV] |
|---|---|---|---|
| Example 23 | $[AlO_2]^-$ | $Al^{+3}$ | 2.80 |
| Example 24 | $[GaO_2]^-$ | $Ga^{+3}$ | 3.45 |
| Example 25 | $[BO_2]^-$ | $B^{+3}$ | 2.63 |
| Example 26 | $[BeO_2]^{-2}$ | $Be^{+2}$ | 3.53 |
| Example 27 | $[MgO_2]^{-2}$ | $Mg^{+2}$ | 3.91 |
| Example 28 | $[LiO_2]^{-3}$ | $Li^+$ | 3.94 |
| Comparative Example 14 | $[SiO_2]$ | $Si^{+4}$ | 0.33 |
| Comparative Example 15 | $[ZrO_2]$ | $Zr^{+4}$ | 0.33 |
| Comparative Example 16 | — | — | 0 |

As shown in Table 5, in the capacitors of Examples 23 to 28, by the arrangement of the anodized layer as the interlayer between the metal electrode and the dielectric layer, the laminate including the interlayer had an increased SBH. Without being limited to particular theory, this increase in the Schottky barrier height is considered to be because the anionized layer induced screening charge having an opposite polarity to the corresponding electrode, and thus led to an additional electrostatic potential difference between the electrode and the dielectric layer.

Accordingly, it was confirmed that the anionized layer arranged as the interlayer between the electrode and the dielectric layer is suitable as a leakage current blocking layer for the capacitor.

Meanwhile, in the capacitors of Comparative Example 14 and 15, by the arrangement of the neutral layer as the interlayer between the electrode and the dielectric layer, an increase in the SHB of the laminate including the interlayer was insignificant.

Evaluation Example 6: Schottky Barrier Height (SBH) Calculation, Metal Oxide Electrode/Anionized Layer/Dielectric Layer, Thickness Changes An amount of change (ΔV) of the Schottky barrier height (SBH) of a laminate, in which a first anionized layer is arranged as the interlayer between $RuO_2$ and $TiO_2$, with respect to a laminate of $RuO_2$ (electrode)/$TiO_2$ (dielectric) was calculated, and some of the results are shown in Table 6.

Referring to FIGS. 5A to 5D, the anionized layer is arranged as the interlayer between $RuO_2$ and $TiO_2$. The thickness of the interlayer is 1 unit cell, 2 unit cells, or 3 unit cells.

The calculation method was the same as in Evaluation Example 1.

TABLE 6

| | Interlayer | Cation of Interlayer | Amount of change in SBH [eV] | Number of unit cells |
|---|---|---|---|---|
| Example 29 | $[AlO_2]^-$ | $Al^{+3}$ | 1.05 | 1 |
| Example 30 | $[AlO_2]^-$ | $Al^{+3}$ | 1.18 | 2 |
| Example 31 | $[AlO_2]^-$ | $Al^{+3}$ | 1.33 | 3 |
| Example 32 | $[GaO_2]^-$ | $Ga^{+3}$ | 1.03 | 1 |
| Example 33 | $[GaO_2]^-$ | $Ga^{+3}$ | 1.23 | 2 |
| Example 34 | $[GaO_2]^-$ | $Ga^{+3}$ | 1.26 | 3 |
| Comparative Example 17 | — | — | 0 | 0 |

As shown in Table 6, in the capacitors of Examples 29 to 34, by the arrangement of the anodized layer as the interlayer between the metal electrode and the dielectric layer, as the thickness of the interlayer increased, the SBH of the laminate including the interlayer increased.

Accordingly, it was confirmed that as the thickness of the anionized layer arranged as the interlayer between the electrode and the dielectric layer increased, the interlayer was suitable as a leakage current blocking layer for the capacitor.

As described above, according to one or more embodiments, by including an interlayer having a novel structure, a capacitor may have reduced leakage current.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:

a first thin-film electrode layer;

a second thin-film electrode layer;

a dielectric layer, including a binary metal oxide, between the first thin-film electrode layer and the second thin-film electrode layer; and an interlayer, including an anionized layer, between the dielectric layer and at least one of the first thin-film electrode layer or the second thin-film electrode layer, wherein the interlayer has a same type of crystal structure as and a different composition from the dielectric layer, the anionized layer includes at least one of a monovalent cation, a divalent cation, or a trivalent cation, and the anionized layer has an unbalanced charge such that a total charge of the anionized layer is negative.

2. The capacitor of claim 1, wherein the anionized layer is represented by $[A1O_2]^{-a}$, wherein A1 is the at least one of the monovalent cation, the divalent cation, or the trivalent cation, and a is 1, 2, or 3.

3. The capacitor of claim 2, wherein A1 is an element that belongs to one of Group 1 to Group 13 of the periodic table of elements.

4. The capacitor of claim 2, wherein A1 is at least one of Li, Na, K, Rb, Cs, Mg, Be, Ba, Ca, Ga, Al, B, or In.

5. The capacitor of claim 2, wherein the anionized layer is represented by at least one of $[AlO_2]^-$, $[GaO_2]^-$, $[InO_2]^-$, $[BO_2]^-$, $[BeO_2]^{-2}$, $[MgO_2]^{-2}$, $[BaO_2]^{-2}$, $[CaO_2]^{-2}$, $[LiO_2]^{-3}$, $[NaO_2]^{-3}$, $[KO_2]^{-3}$, or $[RbO_2]^{-3}$.

6. The capacitor of claim 1, wherein the interlayer is represented by Formula 1:

$[A2_aO_b]$ <Formula 1> wherein, in Formula 1, A2 is the at least one of the monovalent cation, the divalent cation, or the trivalent cation, and $1.0 \le a \le 3.0$, $2.0 \le b \le 5.0$, and $0.5 < b/a \le 2.5$.

7. The capacitor of claim 1, wherein the anionized layer is represented by Formula 2:

$[A3O_x]$ <Formula 2> wherein, in Formula 2, A3 is the at least one of the monovalent cation, the divalent cation, or the trivalent cation, and $0.5 < x \le 2.0$.

8. The capacitor of claim 1, wherein the interlayer includes at least one of $[AlO_x]$, $[GaO_x]$, $[InO_x]$, $[BO_y]$, $[BeO_y]$, $[MgO_y]$, $[BaO_y]$, $[CaO_y]$, $[LiO_z]$, $[NaO_z]$, $[KO_z]$, or $[RbO_z]$, $1.5 < x \le 2.0$, $1 < y \le 2$, and $0.5 < z \le 2$.

9. The capacitor of claim 1, wherein a thickness of the interlayer comprises one to three unit cells and is about 1 Å to about 15 Å.

10. The capacitor of claim 1, wherein a Schottky barrier height (SBH) between the dielectric layer and the least one of the first thin-film electrode layer or the second thin-film electrode layer is 1.5 eV or more, and the interlayer is an epitaxial interlayer.

11. The capacitor of claim 1, wherein the interlayer increases a Schottky barrier height (SBH) of the capacitor by 0.5 eV or more.

12. The capacitor of claim 1, wherein the binary metal oxide is represented by Formula 3:

$A4_aO_b$ <Formula 3> wherein, in Formula 3, A4 is at least one of a monovalent cation, a divalent cation, or a trivalent cation, and $1.0 \le a \le 3.0$, and $2.0 \le b \le 5.0$.

13. The capacitor of claim 12, wherein A4 is an element that belongs to one of Group 3 to Group 14 of the periodic table of elements.

14. The capacitor of claim 1, wherein the dielectric layer includes at least one of $TiO_2$, $HfO_2$, $ZrO_2$, $SiO_2$, $Al_2O_3$, $La_2O_3$, $GdO_2$, $SrO_2$, $Y_2O_3$, $La_2O_3$, $Nb_2O_5$, $Ta_2O_5$, $Cr_2O_3$, CuO, $Fe_2O_3$, $Ga_2O_3$, $In_2O_3$, MgO, $Nb_2O_5$, NiO, $SnO_2$, $Ta_2O_5$, $Sc_2O_3$, $GeO_2$, $CeO_2$, $PrO_x$ (wherein x=1 to 5), $Nd_2O_3$, $Sm_2O_3$, $EuO_y$ (wherein y=1 to 5), $Gd_2O_3$, $Dy_2O_3$, $Ho_2O_3$, $Er_2O_3$, $Tm_2O_3$, $Yb_2O_3$, or $Lu_2O_3$.

15. The capacitor of claim 1, wherein the dielectric layer has a thickness of about 5 nm to about 100 nm, and the first thin-film electrode layer and the second thin-film electrode layer each independently have a thickness of about 10 nm to about 1000 nm.

16. The capacitor of claim 1, wherein the first thin-film electrode layer and the second thin-film electrode layer each independently include a conductive material, at least one of the conductive materials including at least one of a metal, a metal oxide, a doped metal oxide, a metal nitride, and a metal carbide.

17. The capacitor of claim 16, wherein, in the conductive material:

the metal comprises at least one of Ti, W, Ta, Co, Mo, Ni, V, Hf, Al, Cu, Pt, Pd, Ir, Au, and Ru, the metal oxide comprises at least one of $RuO_2$, $IrO_2$, $PtO_2$, $MnO_2$, $Sb_2O_3$, and $In_2O_3$, the doped metal oxide comprises at least one of Ta-doped $SnO_2$, Ti-doped $In_2O_3$, Ni-doped $SnO_2$, Sb-doped $SnO_2$, and Al-doped ZnO, and the metal nitride comprises at least one of TiN, WN, TaN, TiAlN, TaSiN, TiSiN, WSiN, TiAlN, TiCN, TiAlCN, RuCN, and RuTiN.

18. An electronic device comprising the capacitor of claim 1.

19. The electronic device of claim 18, wherein the electronic device is a semiconductor device.

20. A method of manufacturing a capacitor, the method comprising:

forming one of a first thin-film electrode layer or a second thin-film electrode layer;

epitaxially growing an interlayer, including an anionized layer, on one surface of the one of the first thin-film electrode layer or the second thin-film electrode layer;

arranging a dielectric layer, including a binary metal oxide, on the interlayer; and arranging a remainder one of the first thin-film electrode layer or the second thin-film electrode layer on the dielectric layer wherein the interlayer has a same type of a crystal structure as and a different composition from the dielectric layer, and the anionized layer includes at least one of a monovalent cation, a divalent cation, or a trivalent cation, and the anionized layer has an unbalanced charge such that a total charge of the anionized layer is negative.

* * * * *